United States Patent
Shijo et al.

(10) Patent No.: US 11,271,575 B2
(45) Date of Patent: Mar. 8, 2022

(54) RESONANCE GENERATION METHOD AND ATOMIC OSCILLATOR

(71) Applicant: Seiko Epson Corporation, Toyko (JP)

(72) Inventors: Kotaro Shijo, Chino (JP); Yoshiyuki Maki, Suwa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/207,830

(22) Filed: Mar. 22, 2021

(65) Prior Publication Data

US 2021/0297085 A1   Sep. 23, 2021

(30) Foreign Application Priority Data

Mar. 23, 2020  (JP) .............................. JP2020-050651

(51) Int. Cl.
| | |
|---|---|
| *H03L 7/26* | (2006.01) |
| *G01R 33/26* | (2006.01) |
| *G04F 5/14* | (2006.01) |

(52) U.S. Cl.
CPC ................ *H03L 7/26* (2013.01); *G01R 33/26* (2013.01); *G04F 5/145* (2013.01)

(58) Field of Classification Search
CPC ............ G01R 33/26; G04F 5/145; H03L 7/26

USPC ....................................................... 331/3, 94.1
See application file for complete search history.

(56) References Cited

U.S. PATENT DOCUMENTS

2016/0105149 A1* 4/2016 Ishihara .................... G04F 5/14
                                                              331/94.1
2016/0269037 A1* 9/2016 Goka ....................... G04F 5/145

FOREIGN PATENT DOCUMENTS

JP           2016-171419 A      9/2016

* cited by examiner

*Primary Examiner* — Arnold M Kinkead
(74) *Attorney, Agent, or Firm* — Harness, Dickey & Pierce, P.L.C.

(57) ABSTRACT

In a resonance generation method, a Ramsey resonance is generated by repeating a first period and a second period. In the first period, an atomic cell, in which an alkali metal atom is accommodated and a hydrocarbon film is disposed on an inner wall, is irradiated with light having a first intensity while sweeping a center frequency within a sweep range, and a center frequency of light with which the atomic cell is to be irradiated in a next first period is determined based on a light intensity signal obtained by detecting light transmitted through the atomic cell. In the second period, an intensity of light incident on the atomic cell is reduced as compared with the first intensity.

6 Claims, 13 Drawing Sheets

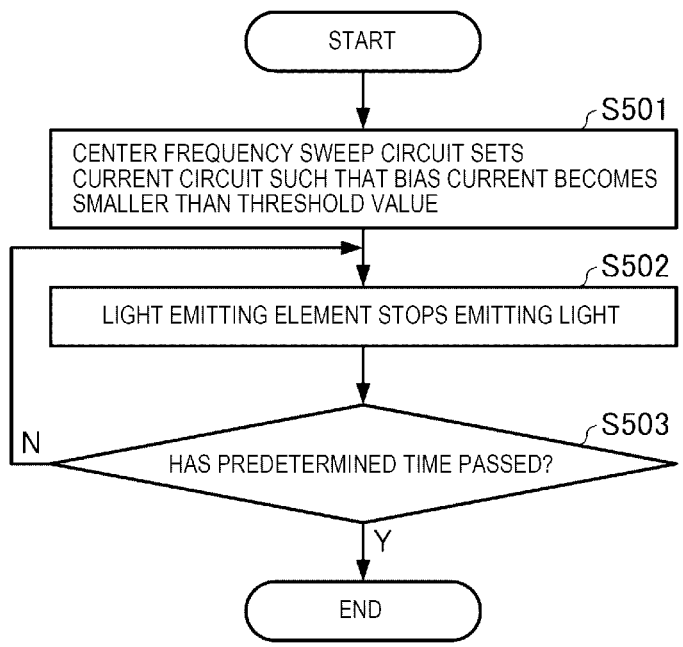

RESONANCE GENERATION METHOD AND ATOMIC OSCILLATOR

The present application is based on, and claims priority from JP Application Serial Number 2020-050651, filed Mar. 23, 2020, the disclosure of which is hereby incorporated by reference herein in its entirety.

BACKGROUND

1. Technical Field

The present disclosure relates to a resonance generation method and an atomic oscillator.

2. Related Art

In recent years, an atomic oscillator using coherent population trapping (CPT), which is one of the quantum interference effects, has been proposed. This atomic oscillator causes an electromagnetically induced transparency (EIT) phenomenon in which absorption of coherent light is stopped by irradiating an alkali metal atom with coherent light having two different types of wavelength, detects an EIT signal, which is a steep signal generated by the EIT phenomenon, with a photodetector, and generates a frequency signal with the EIT signal as a reference.

Further, in JP-A-2016-171419, a laser light having at least two wavelengths is generated by filling a current into a laser light emitting element, an alkali metal cell where the alkali metal is sealed is irradiated with the laser light, a value of a DC component of the current applied to the laser light emitting element is set larger than an oscillation threshold value of the laser light emitting element in a first period and set smaller than the value of the DC component of the current in the first period in a second period following the first period, and a CPT resonance method has been proposed in which Ramsey resonance is generated by repeating the first period and the second period a plurality of times. According to this resonance method, since a Ramsey fringe appears, which has a signal shape in which fine vibrations are superimposed on the EIT signal, a more accurate atomic oscillator can be realized by using a peak of the Ramsey fringe.

In the CPT resonance method described in JP-A-2016-171419, since the buffer gas is sealed in the alkali metal cell, by the alkali metal colliding with the buffer gas, a phenomenon called a buffer gas shift occurs in which the peak frequency of the Ramsey fringe fluctuates. To avoid this, by coating an inner wall of the cell with a coherence relaxation prevention film, it is possible to generate the Ramsey resonance without sealing the buffer gas in the cell, but a range of a resonance wavelength of an alkali metal atom becomes narrow. As a result, when the wavelength of light with which the cell is irradiated is slightly shifted, the alkali metal does not interact with the light. Since the amount of light with which the cell is irradiated is reduced, it is difficult to give feedback on a wavelength control of the light. Therefore, when the wavelength of the light with which the cell is to be irradiated shifts in the next first period due to some factor generated in the second period, a clear Ramsey fringe cannot be obtained, and it is difficult to stably generate the Ramsey resonance.

SUMMARY

A resonance generation method according to an aspect of the present disclosure includes: in a first period, causing an electromagnetically induced transparency phenomenon in a plurality of alkali metal atoms by irradiating an atomic cell, in which the plurality of alkali metal atoms are accommodated and a hydrocarbon film is disposed on an inner wall, with light while changing a center frequency; in the first period, obtaining a light intensity signal by detecting light transmitted through the atomic cell; in the first period, detecting an absorption base of light by the plurality of alkali metal atoms by detecting the light intensity signal; in the first period, determining a center frequency of light with which the atomic cell is to be irradiated in a next first period based on a result of detection of the absorption base; in a second period, reducing an intensity of light incident on the atomic cell as compared with an intensity of light incident on the atomic cell in the first period; and generating a Ramsey resonance by repeating the first period and the second period.

An atomic oscillator according to another aspect of the present disclosure includes: a light source; an atomic cell in which a plurality of alkali metal atoms are accommodated and a hydrocarbon film is disposed on an inner wall; a photodetector; and a control circuit, in which the control circuit is configured to, in a first period, cause an electromagnetically induced transparency phenomenon in the plurality of alkali metal atoms by irradiating the atomic cell with light from the light source while changing a center frequency and increasing and decreasing a frequency of a sideband, and in a second period, reduce an intensity of light incident on the atomic cell as compared with an intensity of light incident on the atomic cell in the first period, the photodetector is configured to, in the first period, output a light intensity signal by detecting light transmitted through the atomic cell, and the control circuit is configured to, in the first period, detect an absorption base of light by the plurality of alkali metal atoms by detecting the light intensity signal, determine a center frequency of light with which the atomic cell is to be irradiated in a next first period based on a result of detection of the absorption base, in the first period, detect a peak of an intensity of the light transmitted through the atomic cell by detecting the light intensity signal, and generate a Ramsey resonance by repeating the first period and the second period.

BRIEF DESCRIPTION OF THE DRAWINGS

FIG. 18 is a flowchart illustrating an example of a procedure of a control for a second period.

DESCRIPTION OF EXEMPLARY EMBODIMENTS

Hereinafter, a preferred embodiment of the present disclosure will be described in detail with reference to the accompanying drawings. Note that the embodiment to be described below does not unduly limit the contents of the disclosure described in the appended claims. In addition, all configurations to be described below are not limited to being essential constituent conditions of the disclosure.

1. Resonance Generation Method

Figure 1:
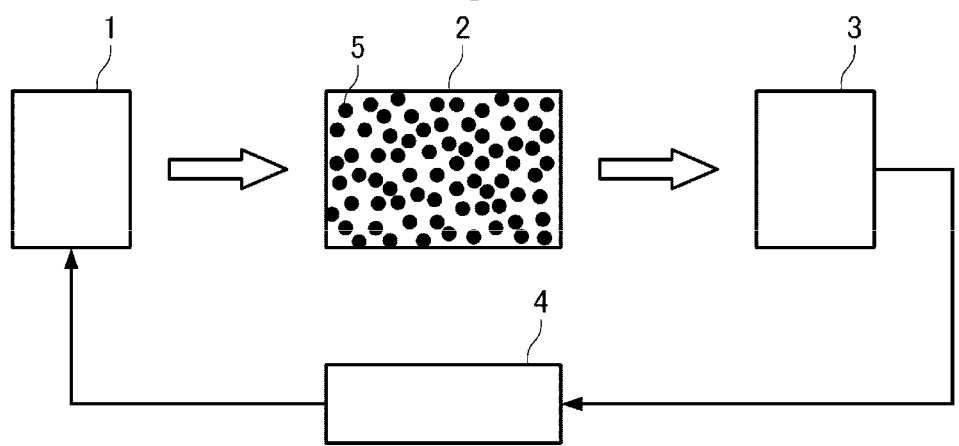
FIG. 1 is a conceptual diagram for explaining a resonance generation method of the present embodiment.

FIG. 1 is a conceptual diagram for explaining a resonance generation method of the present embodiment. As illustrated in FIG. 1, in the present embodiment, a light source 1 irradiates an atomic cell 2 with light, a photodetector 3 detects the light transmitted through the atomic cell 2 of the light incident on the atomic cell 2, and a control circuit 4 controls a frequency of the light emitted by the light source 1 based on a light intensity signal of the photodetector 3. For example, the light source 1 may be a vertical cavity surface emitting laser (VCSEL). A plurality of gaseous alkali metal atoms 5 are accommodated in the atomic cell 2. The alkali metal atom 5 is, for example, cesium, rubidium, sodium, or potassium.

Figure 2:
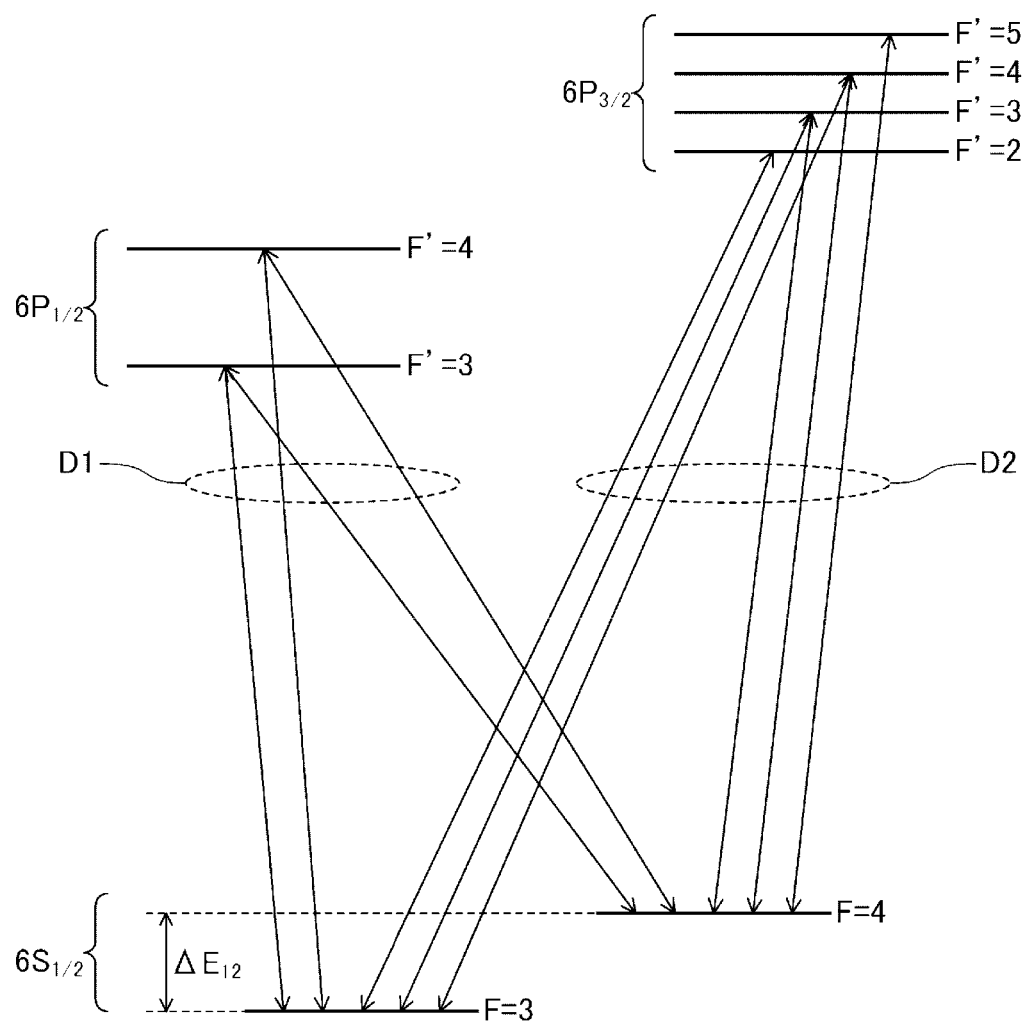
FIG. 2 is a diagram illustrating an energy level of a cesium atom.

FIG. 2 is a diagram illustrating an energy level of a cesium atom. As illustrated in FIG. 2, it is known that the cesium atom has a ground level of $6S_{1/2}$ and two excitation levels of $6P_{1/2}$ and $6P_{3/2}$. Further, each level of $6S_{1/2}$, $6P_{1/2}$, and $6P_{3/2}$ has a hyperfine structure divided into a plurality of energy levels. Specifically, $6S_{1/2}$ has two ground levels of F=3, 4, and $6P_{1/2}$ has two excitation levels of F'=3, 4, and $6P_{3/2}$ has four excitation levels of F'=2, 3, 4, 5.

For example, by absorbing a D1 line, the cesium atom at the ground level of F=3 of $6S_{1/2}$ can transition to any of the excitation levels of F'=3 and 4 of $6P_{1/2}$. By absorbing the D1 line, the cesium atom at the ground level of F=4 of $6S_{1/2}$ can transition to any of the excitation levels of F'=3 and 4 of $6P_{1/2}$. Conversely, the cesium atom at any of the excitation levels of F'=3 and 4 of $6P_{1/2}$ can transition to the ground level of F=3 or F=4 of $6S_{1/2}$ by releasing the D1 line. The three levels configured with the two ground levels of F=3 and 4 of $6S_{1/2}$ and the excitation levels of any of the F'=3 and 4 of $6P_{1/2}$ are called Λ-type 3 levels because a Λ-type transition due to the absorption and light emission of the D1 line is possible.

On the other hand, by absorbing a D2 line, the cesium atom at the ground level of F=3 of $6S_{1/2}$ can transition to any of the excitation levels of F'=2, 3, and of $6P_{3/2}$, but it is not possible to transition to the excitation level of F'=5. By absorbing the D2 line, the cesium atom at the ground level of F=4 of $6S_{1/2}$ can transition to any of the excitation levels of F'=3, 4, and of $6P_{3/2}$, but it is not possible to transition to the excitation level of F'=2. These are based on the transition selection rule when an electric dipole transition is assumed. Conversely, the cesium atom at any of the excitation levels of F'=3 and 4 of $6P_{3/2}$ can transition to the ground level of F=3 or F=4 of $6S_{1/2}$ by releasing the D2 line. The three levels configured with the two ground levels of F=3 and 4 of $6S_{1/2}$ and the excitation levels of any of the F'=3 and 4 of $6P_{3/2}$ form the Λ-type 3 levels because the Λ-type transition due to the absorption and light emission of the D2 line is possible. In contrast to this, the cesium atom at the excitation level of F'=2 of $6P_{3/2}$ releases the D2 line and always transitions to the ground level of F'=3 of $6S_{1/2}$. Similarly, the cesium atom at the excitation level of F'=5 of $6P_{3/2}$ releases the D2 line and always transitions to the ground level of F=4 of $6S_{1/2}$. That is, the three levels configured with the two ground levels of F=3 and 4 of $6S_{1/2}$ and the excitation levels of F'=2 or F'=5 of $6P_{3/2}$ does not form the Λ-type 3 levels because the Λ-type transition due to the absorption and releasing of the D2 line is not possible. Alkali metal atoms other than the cesium atom are also known to have two ground levels and an excitation level that form Λ-type 3 levels.

Since each of the plurality of gaseous alkali metal atoms 5 has a velocity in accordance with a movement state, a group of the alkali metal atoms 5 has a constant velocity distribution. When there is a velocity distribution in the group of alkali metal atoms 5, due to the Doppler effect, a distribution occurs in an apparent frequency of the D1 line or D2 line that is resonance light, that is in a frequency of the resonance light seen from the group of alkali metal atoms 5. This means that the excitation levels of the plurality of alkali metal atoms 5 having velocities different from each other are apparently different so that the excitation levels have a certain width broadening. This broadening of the excitation levels is called a Doppler broadening.

Figure 3:
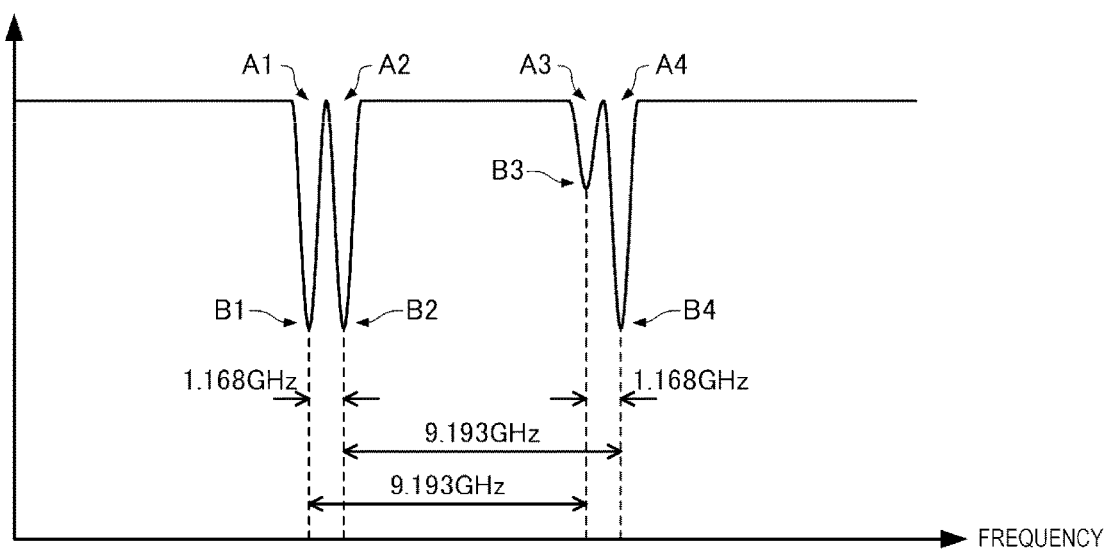
FIG. 3 is a diagram illustrating an example of a relationship between a frequency of light incident on an atomic cell and a transmittance of light transmitted through the atomic cell.

FIG. 3 is a diagram illustrating an example of a relationship between the frequency of light incident on the atomic cell 2 and the transmittance of the light transmitted through the atomic cell 2 when the atomic cell 2 is irradiated with the light while sweeping the frequency from the light source 1. In FIG. 3, the horizontal axis is a frequency of the light incident on the atomic cell 2, and the vertical axis is the transmittance of the light transmitted through the atomic cell 2. In the example of FIG. 3, the plurality of alkali metal atoms 5 accommodated in the atomic cell 2 are cesium atoms, and there are four absorption bands A1 to A4 generated by a part of the group of cesium atoms absorbing the D1 line which is the resonance light. The absorption band A1 is generated by the cesium atom at the ground level of F=4 of $6S_{1/2}$ absorbing the D1 line and transitioning to the excitation level of F'=3 of $6P_{1/2}$. The absorption band A2 is generated by the cesium atom at the ground level of F=4 of $6S_{1/2}$ absorbing the D1 line and transitioning to the excitation level of F'=4 of $6P_{1/2}$. The absorption band A3 is generated by the cesium atom at the ground level of F=3 of $6S_{1/2}$ absorbing the D1 line and transitioning to the excitation level of F'=3 of $6P_{1/2}$. The absorption band A4 is generated by the cesium atom at the ground level of F=3 of $6S_{1/2}$ absorbing the D1 line and transitioning to the excitation level of F'=4 of $6P_{1/2}$.

Each of the absorption bands A1 to A4 has the width corresponding to the Doppler broadening of the excitation level. Further, each of the four absorption bands A1 to A4 has absorption bases B1 to B4 in which the transmittance thereof is minimized by having the largest number of cesium atoms that absorb the resonance light. A frequency corresponding to an energy difference between the two ground levels of F=3 and 4 of $6S_{1/2}$ is substantially 9.193 GHz, and a frequency corresponding to an energy difference between the two excitation levels of F'=3 and of $6P_{1/2}$ is substantially 1.168 GHz. Therefore, the frequency difference of the D1 line absorbed at each of the absorption bases B1 and B2, or the frequency difference of the two types of D1 line absorbed at each of the absorption bases B3 and B4 are substantially 1.168 GHz. Further, the frequency difference of the two types of D1 line absorbed at each of the absorption bases B1 and B3, or the frequency difference of the two types of D1 line absorbed at each of the absorption bases B2 and B4 are substantially 9.193 GHz.

By the way, when the gaseous alkali metal atom 5 is simultaneously irradiated with a first resonance light having a frequency corresponding to the energy difference between a first ground level and the excitation level that form the Λ-type 3 level and a second resonance light having a frequency corresponding to the energy difference between a second ground level and the excitation level, it is known that coherence, which is a superposition state of the two ground levels, is generated, and the electromagnetically induced transparency (EIT) phenomenon occurs in which excitation to the excitation level is stopped.

Figure 4:
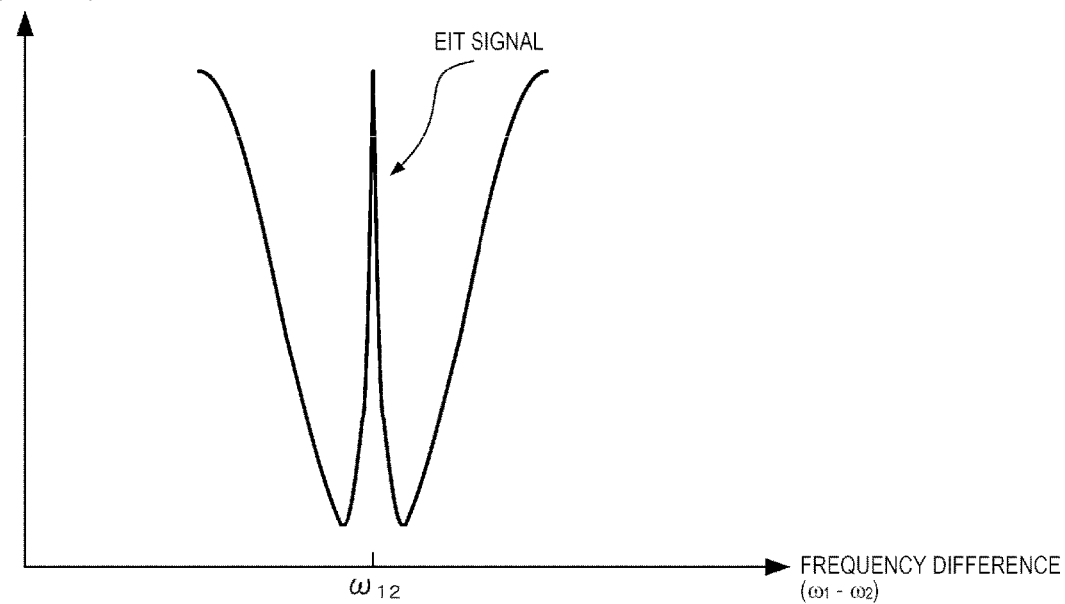
FIG. 4 is a diagram illustrating an example of an EIT signal.

When the EIT phenomenon occurs, the photodetector 3 illustrated in FIG. 1 obtains an EIT signal in which the transmittance of the atomic cell 2 sharply increases. FIG. 4 illustrates an example of the EIT signal. In FIG. 4, the horizontal axis is a frequency difference between the first resonance light and the second resonance light, and the vertical axis is the transmittance of the light transmitted through the atomic cell 2. The EIT signal indicates a peak value when the difference $\omega_1-\omega_2$ between the frequency $\omega_1$ of the first resonance light and the frequency $\omega_2$ of the second resonance light exactly matches a frequency $\omega_{12}$ corresponding to an energy difference $\Delta E_{12}$ between the first ground level and the second ground level. For example, when the gaseous cesium atoms are irradiated with the D1 line that causes the transition from the ground level of F=3 of $6S_{1/2}$ to the excitation level of F'=4 of $6P_{1/2}$ as the first resonance light and the D1 line that causes the transition from the ground level of F=4 of $6S_{1/2}$ to the excitation level of F'=4 of $6P_{1/2}$ as the second resonance light, the EIT phenomenon occurs. The level of the EIT signal indicates the peak value when the frequency difference between the first resonance light and the second resonance light exactly matches substantially 9.193 GHz which is the frequency corresponding to the energy difference between the two ground levels of F=3 and 4 of $6S_{1/2}$.

Figure 5:
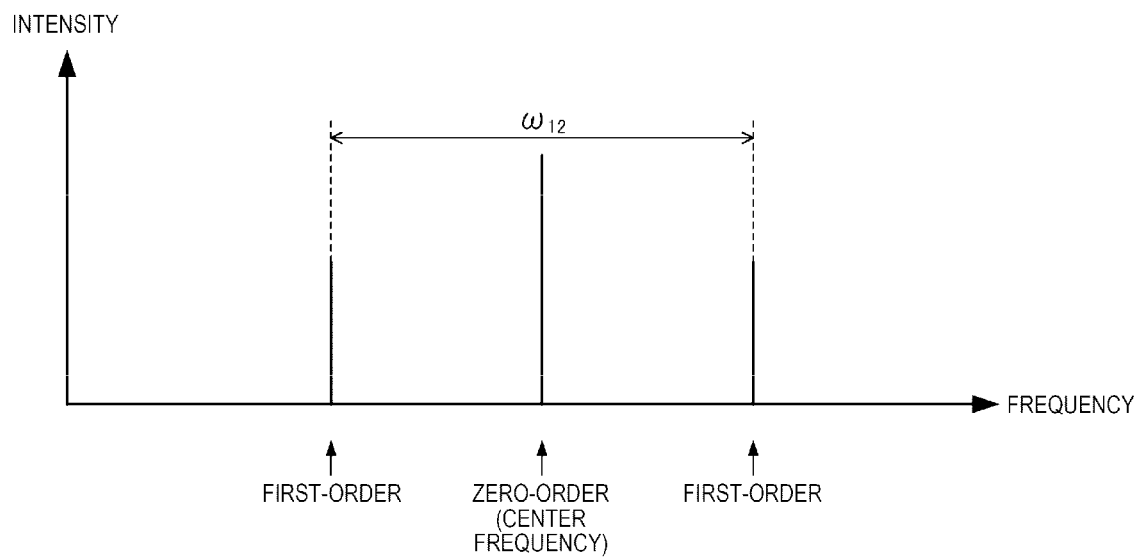
FIG. 5 is a diagram illustrating an example of a frequency spectrum of light emitted from a light source.

FIG. 5 is a diagram illustrating an example of a frequency spectrum of the light emitted from the light source 1. In FIG. 5, the horizontal axis is a frequency and the vertical axis is an intensity. As illustrated in FIG. 5, for example, when the light emitted from the light source 1 includes at least two first-order sidebands, by matching the frequency difference between the two sidebands with the frequency $\omega_{12}$, the EIT phenomenon may occur by using one sideband as the first resonance light and the other sideband as the second resonance light. For example, when the light source 1 is the vertical cavity surface emitting laser, by supplying the light source 1 with a current including a constant current corresponding to the center frequency and a current fluctuating at the frequency of $\omega_{12}/2$ from the control circuit 4 in FIG. 1, the light source 1 can generate light having two sidebands that have a frequency difference of the frequency $\omega_{12}$.

In order to increase the S/N ratio (signal to noise ratio) of the EIT signal, it is desirable that the frequency of the first resonance light matches the frequency corresponding to any of the absorption bases. By using the EIT signal having a high S/N ratio, it is possible to realize an atomic oscillator or the like having a good degree of frequency stability.

Figure 6:
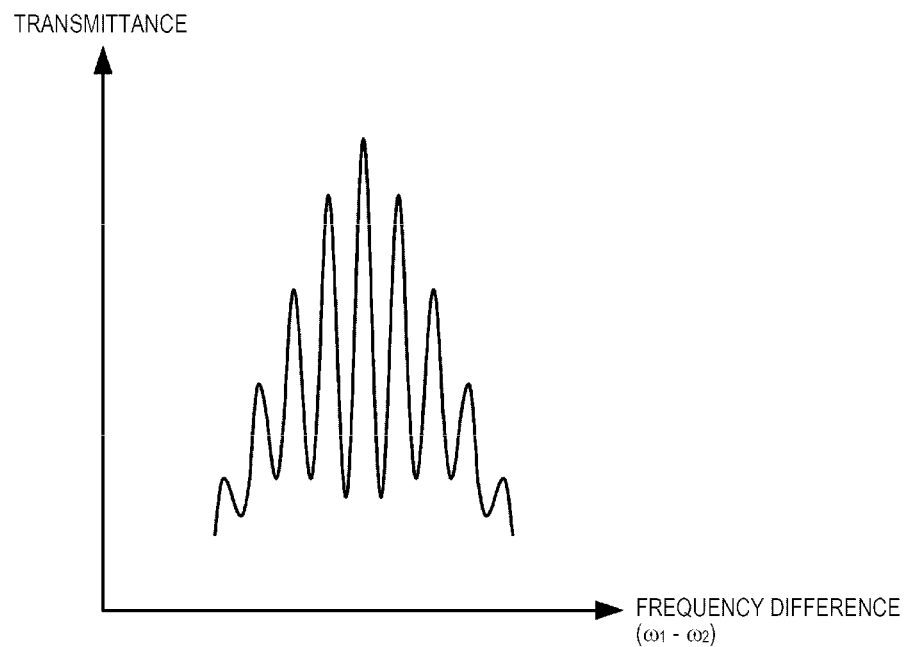
FIG. 6 is a diagram illustrating an example of a Ramsey fringe.

In the present embodiment, by making the light incident on the atomic cell 2 a pulse instead of a continuous wave, the coherence of the pulse-excited alkali metal atom 5 performs free precession and the Ramsey resonance occurs. As a result, the Ramsey fringe that has a signal shape in which fine vibrations are superimposed on the EIT signal appears. FIG. 6 is a diagram illustrating an example of the Ramsey fringe. In FIG. 6, the horizontal axis is a frequency difference between the first resonance light and the second resonance light, and the vertical axis is the transmittance of the light transmitted through the atomic cell 2. Since the peak of one of the fine vibrations of the Ramsey fringe is very thin so the Q value is high, and by using the peak of the Ramsey fringe, the performance of the atomic oscillator or the like is further improved. Further, a phenomenon called a light shift is known in which the peak frequency of the EIT signal fluctuates depending on the intensity of the light incident on the atomic cell 2, but the peak frequency of Ramsey fringe has the advantage that it has low sensitivity with respect to the light shift and is not easily affected by fluctuations in light intensity.

The coherence is generated in the alkali metal atom 5 and the EIT phenomenon occurs by a first pulse of the light incident on the atomic cell 2, thereafter the free precession occurs while the incident of the light on the atomic cell 2 is stopped, and then the Ramsey resonance is generated by a second pulse of the light incident on the atomic cell 2. Therefore, it is necessary to irradiate the alkali metal atom 5 with the second pulse while the coherence is being generated. If a rare gas or the like is sealed in the atomic cell 2 as a buffer gas for suppressing the movement of the alkali metal atom 5, the alkali metal atom 5 can stay within a light irradiation range. However, when the alkali metal atom 5 collides with the buffer gas, a phenomenon called a buffer gas shift occurs in which the peak frequency of the signal fluctuates. Since the amount of the frequency shifts due to the buffer gas shift changes depending on the temperature of the atomic cell 2, or the type and the mixing ratio of the buffer gas, even when the light shift is suppressed by using the peak of the Ramsey fringe, another frequency fluctuation factor remains.

In order to avoid this, it is conceivable that the atomic cell 2 is simply defined as a normal vacuum cell in which the buffer gas is not sealed. However, since there is no buffer gas, the alkali metal atom 5 moves at high speed outside the light irradiation range, and the coherence generated in the alkali metal atom 5 is destroyed by the interaction with a wall surface at the time of the collision with the inner wall of the atomic cell 2. Therefore, even when the coherence is generated in the alkali metal atom 5, the Ramsey resonance cannot be generated by the alkali metal atom 5 that bounces off the wall and returns to the light irradiation range again.

Figure 7:
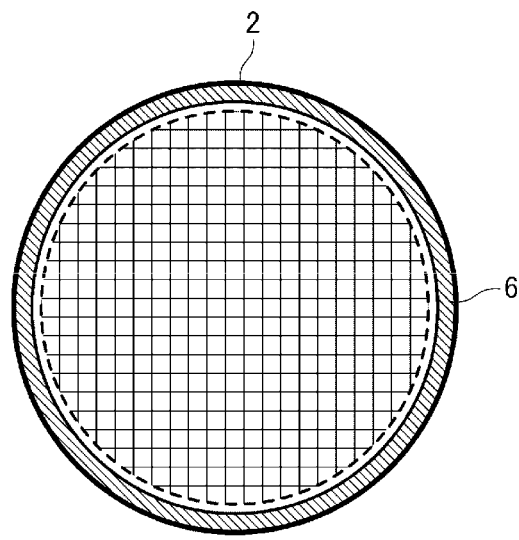
FIG. 7 is a cross-sectional diagram of the atomic cell cut along a plane orthogonal to an incident direction of the light.

Therefore, in the present embodiment, a hydrocarbon film is disposed on the inner wall of the atomic cell 2. FIG. 7 is a cross-sectional diagram of the atomic cell 2 cuts along a plane orthogonal to an incident direction of the light. The hydrocarbon film functions as a coherence relaxation prevention film 6 and a long life of coherence is achieved. For example, when a paraffin is used as the hydrocarbon, the coherence relaxation prevention film 6 having good performance can be obtained. In the example of FIG. 7, the atomic cell 2 has a columnar shape, but it may have a square column shape or a triangular column shape. Further, the coherence relaxation prevention film 6 is preferably disposed on the entire inner wall including an incident surface and an emission surface of the light of the atomic cell 2.

As described above, in the present embodiment, by coating the inner wall of the atomic cell 2 with the coherence relaxation prevention film 6, since the buffer gas is not required, the frequency fluctuation of the peak of the Ramsey fringe due to the buffer gas shift does not occur. Further, in the present embodiment, since the Ramsey resonance is generated by making the light incident on the atomic cell 2 as a pulse, the alkali metal atom 5 does not need to move in and out of the light irradiation range, and may stay within the light irradiation range. Therefore, as illustrated by the mesh in FIG. 7, the cross section of the atomic cell 2 can be made to have the same size as the light irradiation range, and there is an advantage that the atomic cell 2 can be miniaturized.

However, since the atomic cell 2 does not contain the buffer gas, the absorption band of the light due to the buffer gas cannot uniformly broaden, and the width of the absorption band of the light, that is, the range of the resonance frequency of the alkali metal atom 5 is narrowed. As a result, when the center frequency of the light emitted from the light source 1 is slightly shifted, the alkali metal atom 5 rapidly stops interacting with the light. Further, in order to pulse the light incident on the atomic cell 2 in order to generate the Ramsey resonance, the incident of the light on the atomic cell 2 needs to be temporarily stopped, thereby during this stop period, the feedback of center frequency control by the control circuit 4 is not applied. For example, when the light source 1 is the vertical cavity surface emitting laser when the current supplied from the control circuit 4 to the light source 1 fluctuates greatly due to some factors during the stop period, the center frequency of the next light pulse is greatly shifted. Therefore, due to factors such as noise during this stop period, the center frequency of the next light emitted from the light source 1 is shifted, and the stable generation of the Ramsey resonance is hindered.

Therefore, in the present embodiment, the center frequency of the light is swept during the period in which the light is emitted from the light source 1. That is, the light from the light source 1 with which the atomic cell 2 is irradiated is defined as a chirped pulse in which the center frequency thereof is changed. Particularly, in the present embodiment, the center frequency of the light with which the atomic cell 2 is irradiated is changed by using the width in accordance with the Doppler width of the absorption band of the light by the plurality of alkali metal atoms 5.

Figure 8:
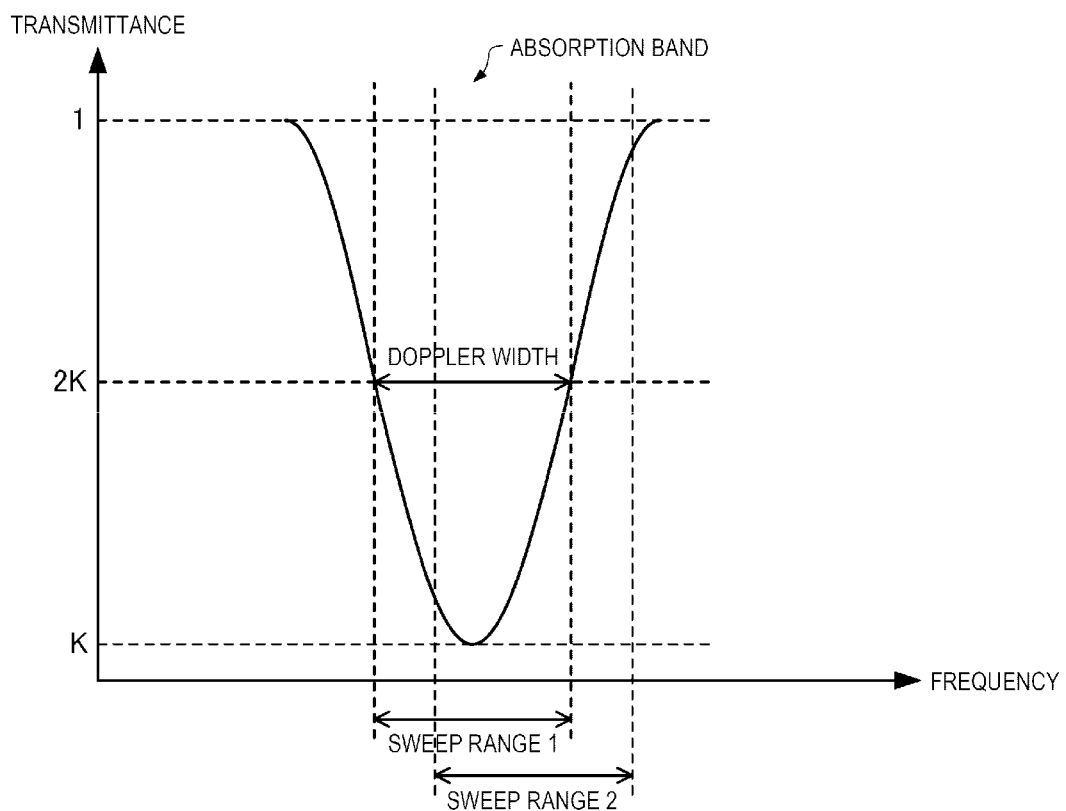
FIG. 8 is a diagram for explaining a relationship between a Doppler width of an absorption band of the light and the width of a sweep range of the center frequency of the light.

FIG. 8 is a diagram for explaining a relationship between the Doppler width of the absorption band of the light and the width of a sweep range of the center frequency of the light. In FIG. 8, the horizontal axis is a center frequency of the light with which the atomic cell 2 is irradiated, and the vertical axis is the transmittance of the light transmitted through the atomic cell 2. As illustrated in FIG. 8, the Doppler width of the absorption band of the light is the width when the amount of the light absorption becomes halved with respect to the absorption base or the width when the light transmittance of the atomic cell 2 is doubled with respect to the absorption base, that is a half value width, for example, the width of the sweep range of the center frequency of light is preferably equal to or more than the Doppler width. For example, since the Doppler width of the absorption band of the light by the cesium atom is substantially 1 GHz, it is preferable that the width of the sweep range of the center frequency is equal to or greater than 1 GHz. By setting the width of the sweep range of the center frequency of the light to be equal to or more than the Doppler width, the frequency of light becomes the resonance frequency somewhere in the pulse even when the center frequency shifts slightly, and the alkali metal atom 5 can interact with light. In the example of FIG. 8, the control circuit 4 detects the absorption base by sweeping the center frequency within a sweep range 1 when the center frequency is not shifted and can detect, for example, the absorption base by sweeping the center frequency within a sweep range 2 even when the center frequency is shifted.

The sweep velocity of the center frequency is determined by the width of one pulse of the light, that is, the time width of the period during which the light is emitted from the light source 1. For example, assuming that the width of one pulse of the light is 4 µs, the sweep velocity of the center frequency is ¼µs=250 kHz. The shorter the pulse width, the clearer the Ramsey fringe can be obtained, but the sweep velocity of the center frequency needs to be increased accordingly. Therefore, the width of the sweep range of the center frequency needs to be determined in consideration of the sweep velocity of the center frequency that can be realized in the light source 1 and the Ramsey fringe to be obtained. For example, when it is desired to increase the sweep velocity of the center frequency as much as possible in order to obtain a clear Ramsey fringe, it is conceivable to make the width of the sweep range of the center frequency smaller than the Doppler width.

Figure 9:
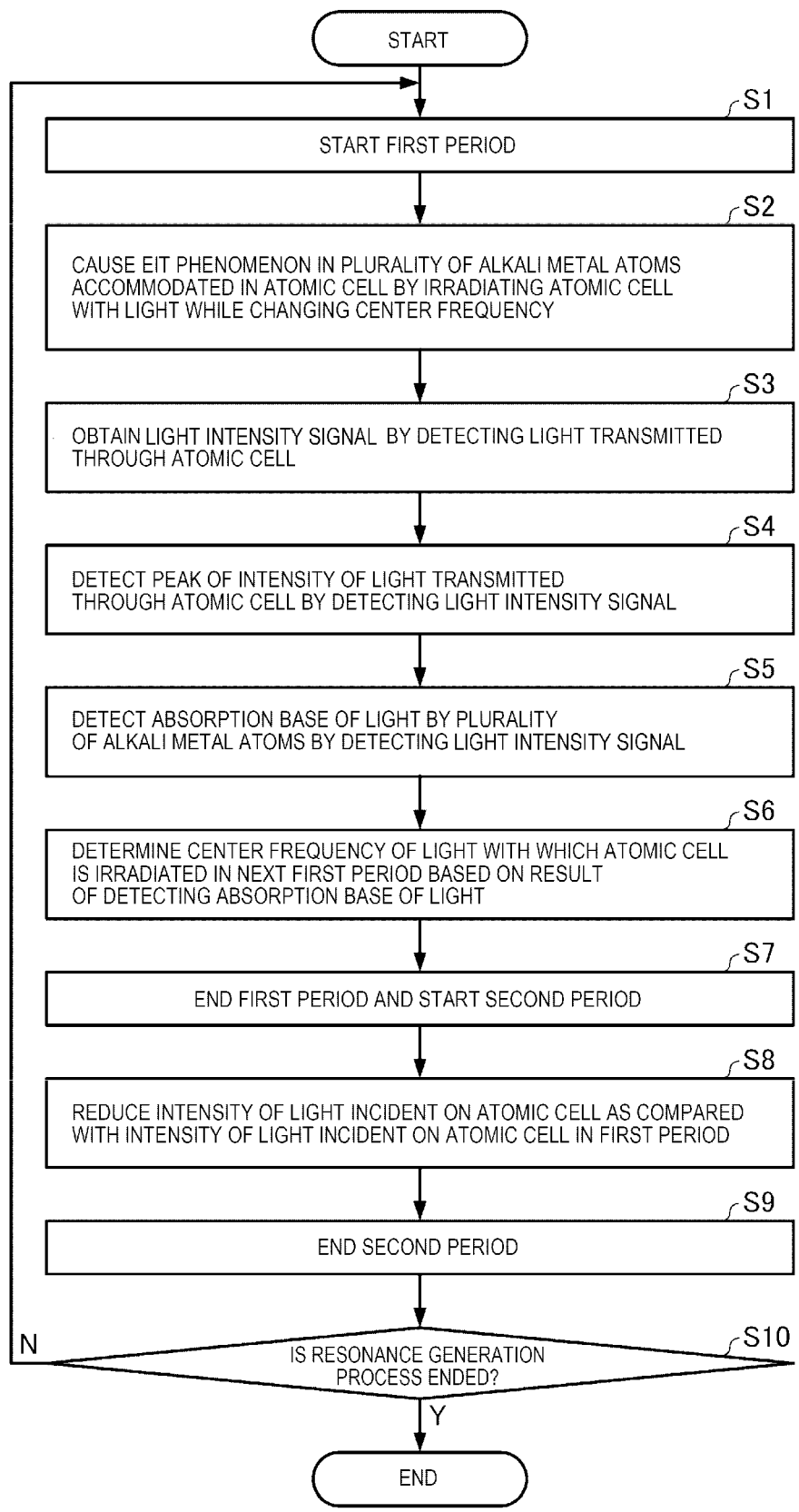
FIG. 9 is a flowchart illustrating an example of a procedure of the resonance generation method of the present embodiment.

FIG. 9 is a flowchart illustrating an example of a procedure of the resonance generation method of the present embodiment. In the resonance generation method of the present embodiment, as illustrated in FIG. 9, the first period is started first (step S1). Thereafter, in the first period, firstly, the light source 1 irradiates the atomic cell 2 with the light while changing the center frequency, thereby the EIT phenomenon occurs in the plurality of alkali metal atoms 5 accommodated in the atomic cell 2 (step S2). The light source 1 may change the center frequency in a direction of increasing or may change the center frequency in a direction of decreasing.

In step S2, the light source 1 may change the center frequency of the light with which the atomic cell 2 is irradiated by using the width in accordance with the Doppler width of the absorption band of the light by the plurality of alkali metal atoms 5. For example, the width for changing the center frequency of the light may be equal to or more than the Doppler width and equal to or less than twice the Doppler width.

Next, the photodetector 3 obtains a light intensity signal by detecting the light transmitted through the atomic cell 2 (step S3).

Next, the control circuit 4 detects the peak of the intensity of the light transmitted through the atomic cell 2 by detecting the light intensity signal obtained in step S3 (step S4). For example, in step S2, the light with which the atomic cell 2 is irradiated may include a sideband, the light source 1 may irradiate the atomic cell 2 with the light while increasing and decreasing the frequency of the sideband, and in step S4, the control circuit 4 may detect the peak by specifying the frequency of the sideband when the intensity of the light transmitted through the atomic cell 2 reaches the peak.

Further, the control circuit 4 detects the absorption base of the light by the plurality of alkali metal atoms 5 by detecting the light intensity signal obtained in step S3 (step S5).

Next, the control circuit 4 determines, in step S2, the center frequency of light with which the atomic cell 2 is to be irradiated in the next first period based on the result of detecting the absorption base of the light in step S5 (step S6).

Next, the first period is ended and the second period is started (step S7). The start and end of each of the first period and the second period are controlled by the control circuit 4. For example, the first period may be ended when a predetermined time has passed from the start of the first period, or the first period may be ended when the width for changing the center frequency reaches a predetermined value in step S2. Thereafter, the control circuit 4 reduces the intensity of the light incident on the atomic cell 2 in the second period as compared with the intensity of the light incident on the atomic cell 2 in the first period (step S8). For example, in step S8, the control circuit 4 may stop the incident of light on the atomic cell 2.

Next, when the second period is ended (step S9) and a resonance generation process is not ended (N in step S10), the next first period is started (step S1). After that, the Ramsey resonance is generated by repeating steps S2 to S6 in the first period and step S8 in the second period until the resonance generation process is ended (Y in step S10).

Figure 10:
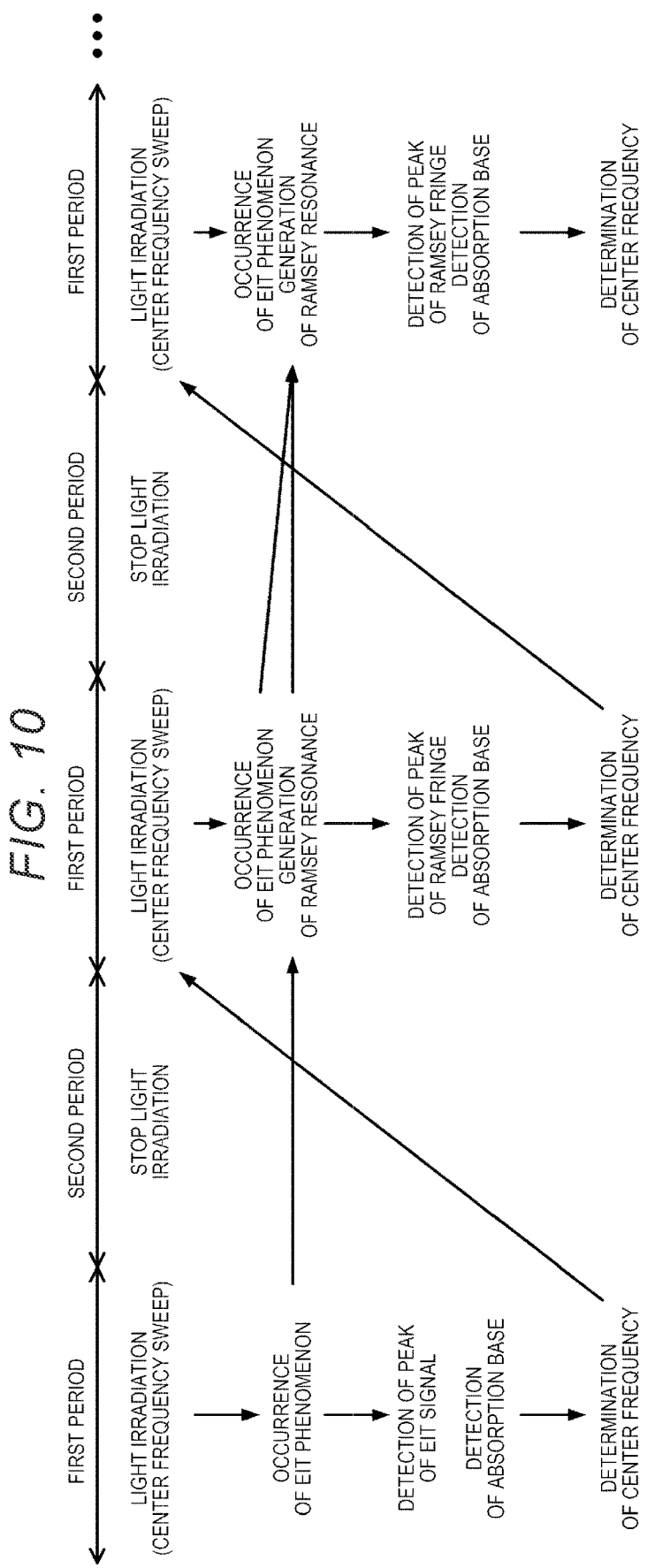
FIG. 10 is a diagram representing processing of the flowchart in FIG. 9 in time series.

FIG. 10 is a diagram representing processing of the flowchart in FIG. 9 in time series. As illustrated in FIG. 10, in the first period for the first time, the sweep range for changing the center frequency in step S2 is set to a predetermined range. For example, the sweep range may be set such that an initial value of the center frequency is the central value of the sweep range. Further, since the Ramsey resonance is not generated in step S2 for the first time, the peak detected in step S4 is the peak of the EIT signal that does not include the Ramsey fringe.

In contrast to this, in the first period after the second time, the sweep range for changing the center frequency in step S2 is set based on the center frequency determined in step S6 in the first period of the previous time. For example, the sweep range may be set such that the determined center frequency is the central value of the sweep range. Further, since the Ramsey resonance is generated in step S2, the peak detected in step S4 is the peak of the Ramsey fringe.

As described above, in the resonance generation method of the present embodiment, by using the atomic cell 2 in which the hydrocarbon film functioning as a coherence relaxation prevention film 6 is disposed on the inner wall, the alkali metal atom 5 for which the coherence is generated in the first period can move while maintaining the coherence even after the alkali metal atom 5 collides with the inner wall. Therefore, in the next first period, the Ramsey resonance is generated by the alkali metal atom 5 that bounces off the inner wall and returns to the light irradiation range. Since the alkali metal atom 5 does not collide with the buffer gas, the buffer gas shift does not occur, and the light shift is significantly suppressed as a characteristic of the Ramsey fringe. Therefore, according to the resonance generation method of the present embodiment, the possibility of the fluctuations in the peak frequency of the Ramsey fringe generated in response to the Ramsey resonance is reduced.

Further, the coherence relaxation prevention film 6 also has an effect of suppressing the adsorption of the alkali metal atom 5 on the wall surface. This is because the adsorption energy is lowered by the coherence relaxation prevention film 6. The light shift is significantly suppressed by the Ramsey fringe, but it is not completely zero. When the incident surface of the light of the atomic cell 2 becomes cloudy due to the adsorption of the alkali metal atom 5 on the inner wall of the atomic cell 2, or when the cloudiness disappears, the intensity of the light incident on the atomic cell 2 fluctuates, thereby the peak frequency of the Ramsey fringe fluctuates slightly. According to the resonance generation method of the present embodiment, since the coherence relaxation prevention film 6 can suppress the adsorption of the alkali metal atom 5 on the wall surface, the possibility of fluctuations in the peak frequency of the Ramsey fringe is reduced.

Further, in the resonance generation method of the present embodiment, even when the center frequency of the light emitted from the light source 1 is shifted from the center frequency determined in the first period due to some factor such as noise generated in the second period, by irradiating the atomic cell 2 with the light while changing the center frequency in the next first period, it is possible to detect the absorption base of the light by the plurality of alkali metal atoms 5 accommodated in the atomic cell 2. Therefore, according to the resonance generation method of the present embodiment, the Ramsey resonance can be stably generated. Particularly, in the first period, by changing the center frequency of the light with which the atomic cell 2 is irradiated with the width in accordance with the Doppler width of the absorption band of the light, the absorption base of the light can be detected more reliably, and the Ramsey resonance can be generated more stably. Further, by changing the center frequency with the width equal to or more than the Doppler width of the absorption band of the light, the absorption base of the light can be detected more reliably, and by changing the center frequency with the width equal to or less than twice the Doppler width of the absorption band of the light, the center frequency can be changed at a velocity that is relatively easy to realize.

Further, according to the resonance generation method of the present embodiment, since the number of alkali metal atoms 5 that contribute to the generation of the Ramsey resonance increases by stopping the incident of the light on the atomic cell 2 in the second period, the Ramsey resonance can be generated more stably.

Further, in the resonance generation method of the present embodiment, since the Ramsey resonance is generated by making the light incident on the atomic cell 2 as a pulse, the alkali metal atom 5 does not need to move in and out of the light irradiation range, and may stay within the light irradiation range. Therefore, according to the resonance generation method of the present embodiment, the cross section of the atomic cell 2 can be made to have the same size as the light irradiation range so that the atomic cell 2 can be miniaturized.

2. Atomic Oscillator

Figure 11:
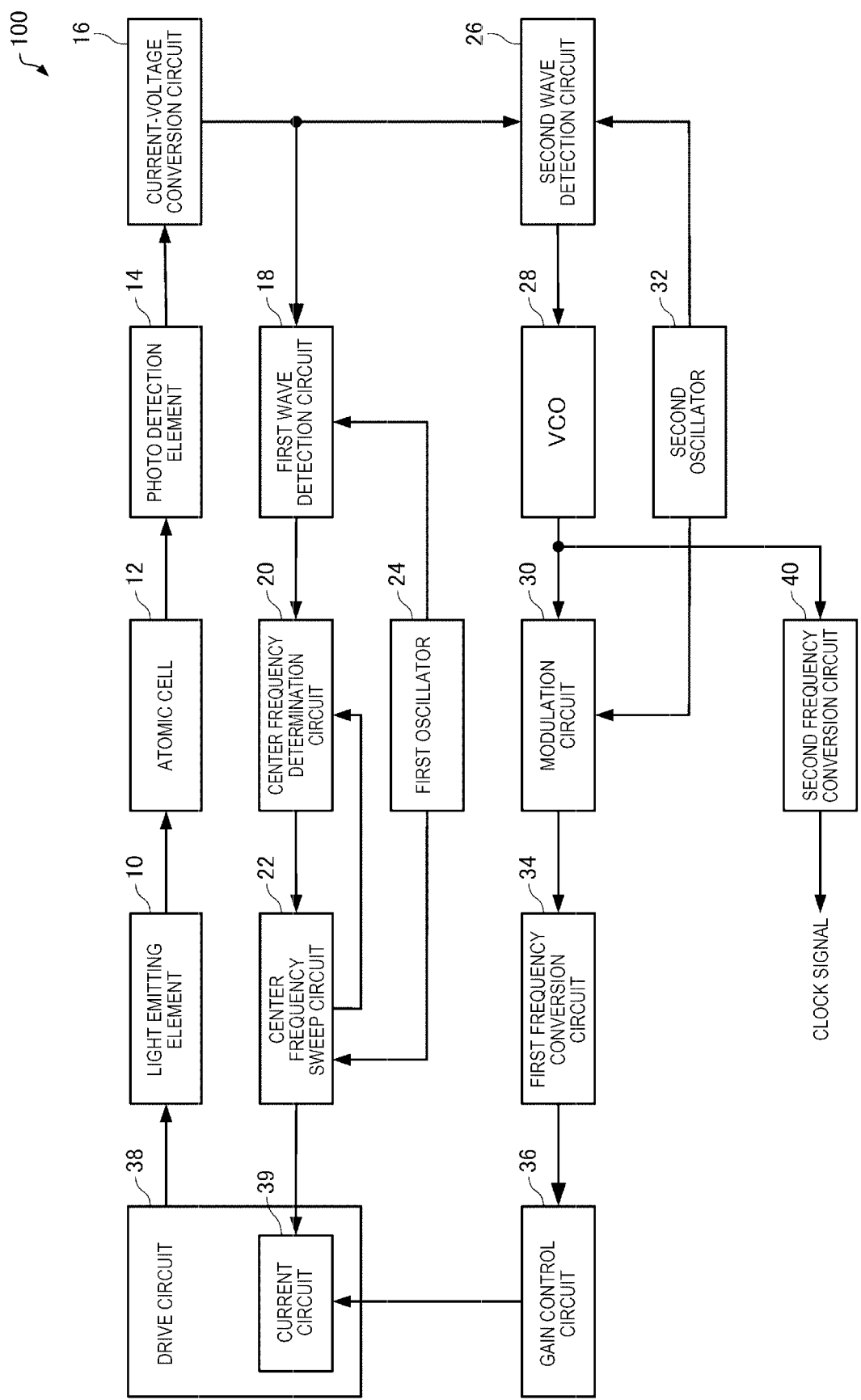
FIG. 11 is a functional block diagram of an atomic oscillator.
Figure 12:
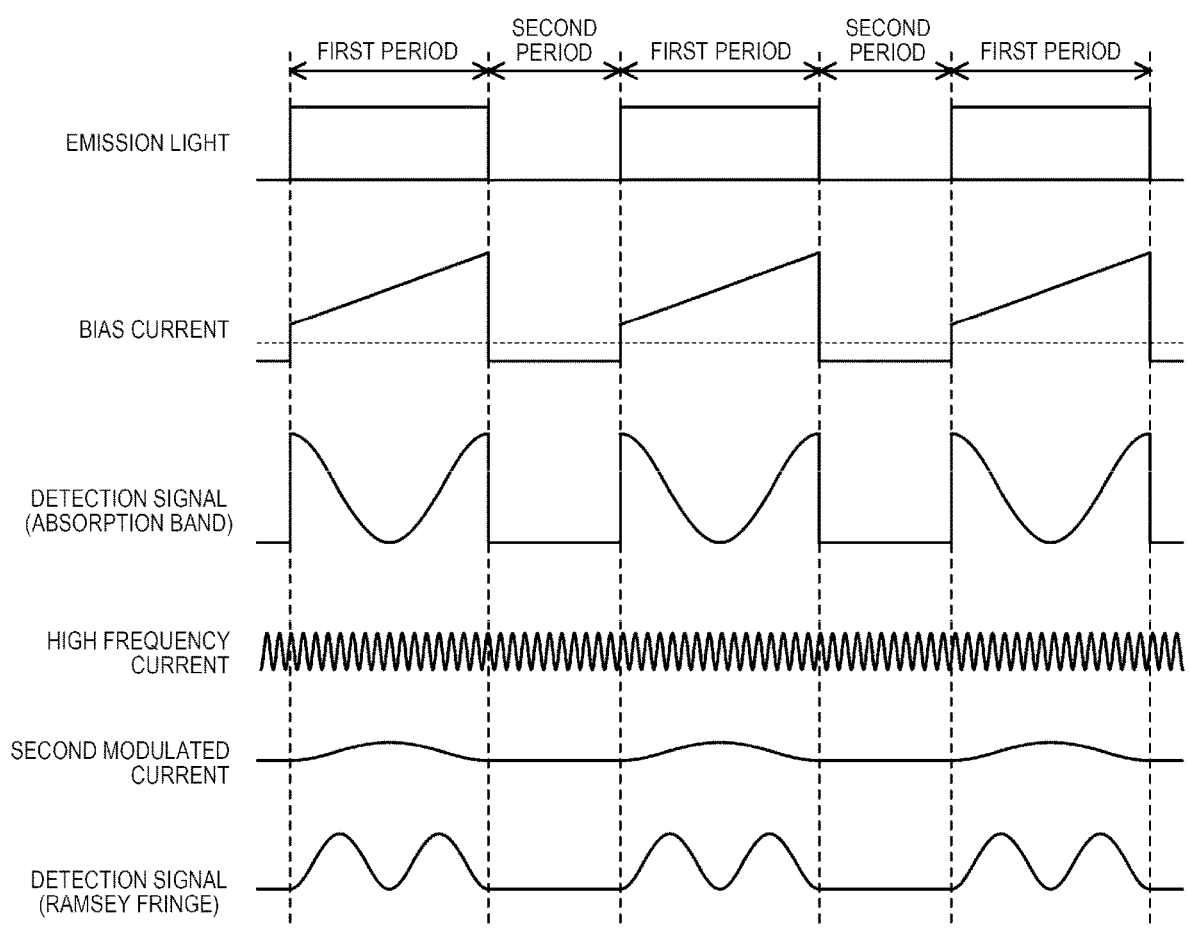
FIG. 12 is a diagram illustrating an example of waveforms of various signals in the atomic oscillator.

Next, an atomic oscillator 100 to which the resonance generation method of the present embodiment described above is applied will be described. The explanation of the content that overlaps with the content already explained will be simplified or omitted. FIG. 11 is a functional block diagram of the atomic oscillator 100. Further, FIG. 12 is a diagram illustrating an example of waveforms of various signals in the atomic oscillator 100.

As illustrated in FIG. 11, the atomic oscillator 100 includes a light emitting element 10, an atomic cell 12, a photo detection element 14, a current-voltage conversion circuit 16, a first wave detection circuit 18, a center frequency determination circuit 20, a center frequency sweep circuit 22, a first oscillator 24, a second wave detection circuit 26, a voltage controlled oscillator (VCO) 28, a modulation circuit 30, a second oscillator 32, a first frequency conversion circuit 34, a gain control circuit 36, a drive circuit 38, and a second frequency conversion circuit 40.

The light emitting element 10 is a light source that emits a pulse of the light toward the atomic cell 12 in the first period. Specifically, as illustrated in FIG. 12, the light emitting element 10 repeats the first period of irradiating the atomic cell 12 with the light while changing the center frequency and the second period of stopping the irradiation of the atomic cell 12 with the light. For example, the first period and the second period may be several µs to several tens of µs, respectively. For example, the light emitting element 10 may be the vertical cavity surface emitting laser.

The plurality of alkali metal atoms such as gaseous cesium, rubidium, sodium, or potassium are accommodated in the atomic cell 12. The inner wall of the atomic cell 12 is coated with a hydrocarbon film such as paraffin or octadecyl trichlorosilane (OTS) that functions as a coherence relaxation prevention film 6. A part of the light incident on the atomic cell 12 passes through the atomic cell 12 and is incident on the photo detection element 14. The atomic oscillator 100 controls the temperature of the atomic cell 12 so as to stabilize at the desired temperature by using a temperature control element such as a Peltier element (not illustrated).

The photo detection element 14 detects the light transmitted through the atomic cell 12 and outputs a light intensity signal in accordance with the intensity of the detected light. The photo detection element 14 is, for example, a photo diode (PD) that outputs a light intensity signal in accordance with the intensity of the received light. The light emitting element 10 emits a pulse of the light toward the atomic cell 12 in the first period. In the first period, the light emitting element 10 emits the light while changing the center frequency so that as illustrated in FIG. 12, a signal corresponding to the absorption band of the light by the plurality of alkali metal atoms accommodated in the atomic cell 12 is included in the light intensity signal output by the photo detection element 14. The output signal of the photo detection element 14 is input to the current-voltage conversion circuit 16.

The current-voltage conversion circuit 16 converts the light intensity signal output by the photo detection element 14 input as a current into a voltage and outputs the voltage. The light intensity signal output by the current-voltage conversion circuit 16 is input to the first wave detection circuit 18 and the second wave detection circuit 26. As described above, a circuit constituted by the photo detection element 14 and the current-voltage conversion circuit 16 is a photodetector that outputs the light intensity signal by detecting the light transmitted through the atomic cell 12 in the first period.

In the first period, the first wave detection circuit 18 detects the light intensity signal output by the current-voltage conversion circuit 16 by using a first oscillation signal output by the first oscillator 24, whereby the absorption base of the light by the plurality of alkali metal atoms accommodated in the atomic cell 12 is detected, and a first wave detection signal is output. The first oscillator 24 oscillates at a first frequency of, for example, substantially several hundred kHz.

Figure 13:
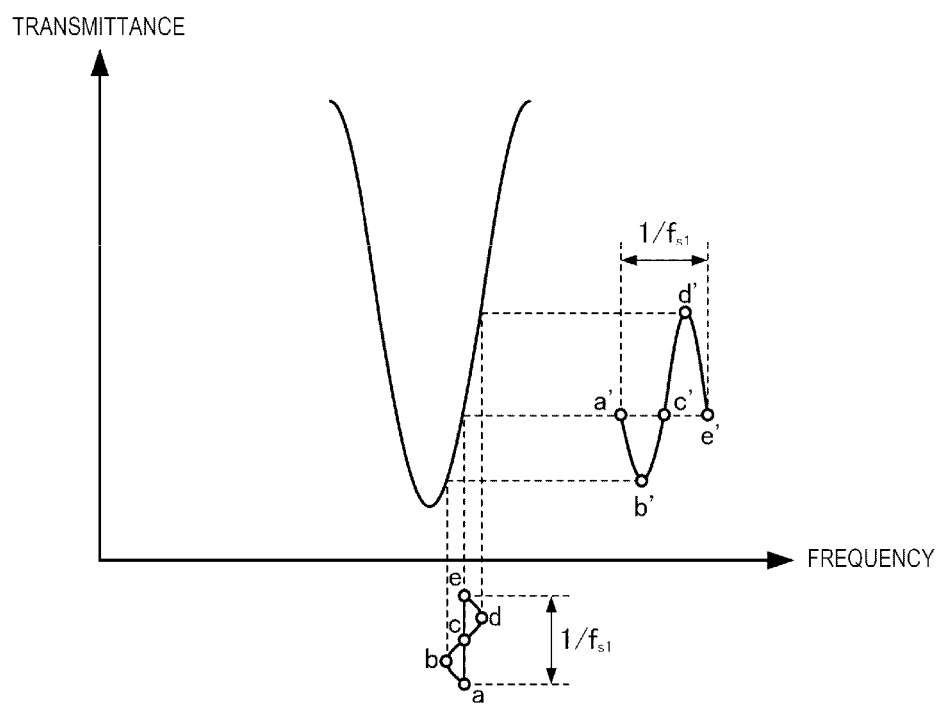
FIG. 13 is a diagram for explaining a principle of a wave detection by a first wave detection circuit.
Figure 14:
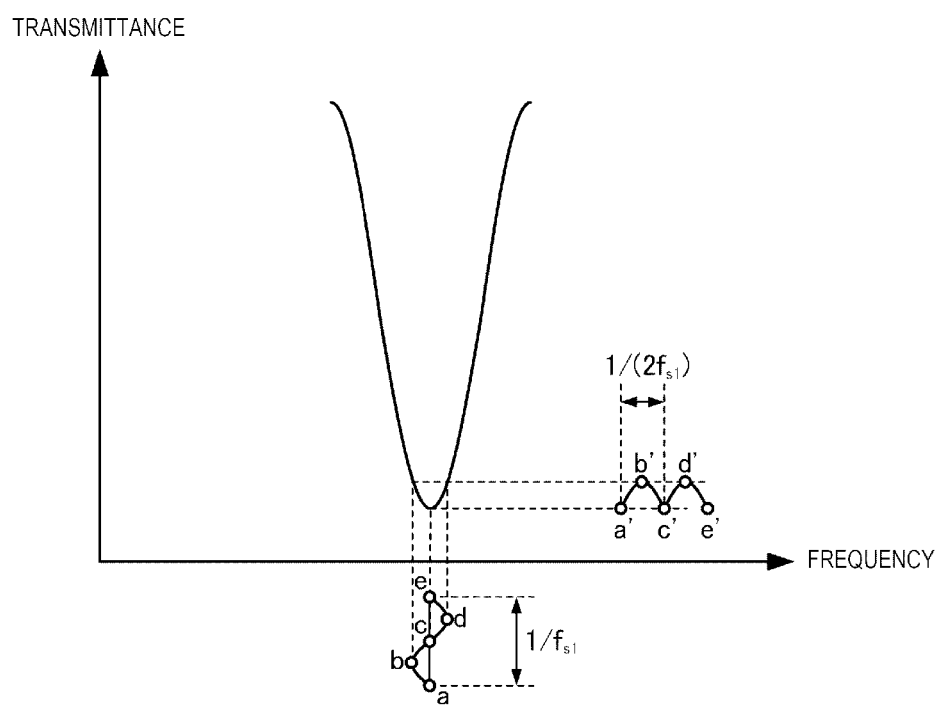
FIG. 14 is a diagram for explaining a principle of a wave detection by the first wave detection circuit.

FIGS. 13 and 14 are diagrams for explaining a principle of a wave detection by the first wave detection circuit 18. In FIGS. 13 and 14, the horizontal axis is a frequency of the light incident on the atomic cell 12, and the vertical axis is the transmittance of the light transmitted through the atomic cell 12.

As illustrated in FIG. 13, when the center frequency of the light emitted by the light emitting element 10 is shifted to a higher side than the minimum point of the absorption band which is the absorption base, since each of points a, b, c, d, and e of the sine wave of the first frequency $f_{s1}$ included in the light appears each of points a', b', c', d', and e' at the output of the photo detection element 14, a large number of frequency components of $f_{s1}$ is contained in the output signal of the photo detection element 14. Therefore, the first wave detection circuit 18 inverts an output signal of the photo detection element 14 by only the polarity of the signals of c' to e' corresponding to half a cycle centering on the voltages of a', c', and e' by using a rectangular wave having a frequency of $f_{s1}$, which is an oscillation signal of the first oscillator 24 whose phase is aligned with the output signal, and then outputs a first wave detection signal, of which a voltage value is negative, by integrating with a filter.

Although not illustrated, when the center frequency is shifted to a lower side than the minimum point of the absorption band, the first wave detection circuit 18 outputs the first wave detection signal of which the voltage value is positive.

On the other hand, as illustrated in FIG. 14, when the center frequency matches the minimum point of the absorption band, a large number of frequency components of $2f_{s1}$ is contained in the output signal of the photo detection element 14, and the waveform of the signal becomes almost symmetrical around the c' point. Therefore, the first wave detection circuit 18 inverts an output signal of the photo detection element 14 by only the polarity of the signals of c' to e' corresponding to half a cycle centering on the voltages of a', c', and e' by using a rectangular wave having a frequency of $f_{s1}$, which is an oscillation signal of the first oscillator 24 whose phase is aligned with the output signal, and then outputs a first wave detection signal, of which the voltage value becomes zero, by integrating with a filter. That is, when the voltage value of the first wave detection signal output by the first wave detection circuit 18 is zero, it indicates that the absorption base is detected. The principle of this wave detection can be applied even when the output signal of the photo detection element 14 is not an integral multiple of one cycle.

In the first period, the center frequency determination circuit 20 determines the center frequency of the light with which the atomic cell 12 is irradiated by the light emitting element 10 in the next first period based on the first wave detection signal that is output by the first wave detection circuit 18. Specifically, when the first wave detection signal output from the first wave detection circuit 18 indicates that the absorption base is detected, the center frequency determination circuit 20 stores the center frequency information output from the center frequency sweep circuit 22 at the end of the first period. The center frequency information is information capable of specifying the value of the center frequency of the light emitted by the light emitting element 10, for example, the information may be the value of the center frequency itself, or may be a value obtained by adding a predetermined offset value to the value of the center frequency. The center frequency determination circuit 20 stores center frequency information capable of specifying an initial value of the center frequency when the first period for the first time is started.

In the first period, the center frequency sweep circuit 22 determines a sweep range of the center frequency of the light emitted by the light emitting element 10 based on the center frequency information stored in the center frequency determination circuit 20, and changes a set value of the drive circuit 38 with respect to a current circuit 39 at regular intervals. As a result, the current value of the bias current generated by the current circuit 39 and supplied to the light emitting element 10 changes at regular intervals, and the center frequency of the light emitted by the light emitting element 10 is swept. For example, the center frequency sweep circuit 22 sweeps the center frequency by changing the center frequency of the light, with which the atomic cell 12 is irradiated by the light emitting element 10, with the width in accordance with the Doppler width of the absorption band of the light by the plurality of alkali metal atoms accommodated in the atomic cell 12. For example, the width for changing the center frequency of the light by the center frequency sweep circuit 22 may be equal to or more than the Doppler width and equal to or less than twice the Doppler width.

An oscillation signal of the first oscillator 24 is input to the center frequency sweep circuit 22. The signal to be input to the center frequency sweep circuit 22 may be an oscillation signal of the first oscillator 24 or may be a signal that is input via a phase shifter or the like from the first oscillator 24. The center frequency sweep circuit 22 changes the center frequency of the light at a velocity synchronized with the oscillation signal of the first oscillator 24 in order to enable the wave detection by the first wave detection circuit 18.

The center frequency sweep circuit 22 may sweep the center frequency using a value obtained by subtracting a value of ½ of the sweep width from the value of the center frequency specified by the center frequency information stored in the center frequency determination circuit 20 as the lower limit value of the sweep range, and using a value obtained by adding a value of ½ of the sweep width to the value of the center frequency as the upper limit value of the sweep range. That is, the value of the center frequency specified by the center frequency information may be a central value of the sweep range. The center frequency sweep circuit 22 may, for example, sweep the center frequency from the lower limit value to the upper limit value of the sweep range at regular intervals, or may sweep the center frequency from the upper limit value to the lower limit value of the sweep range at regular intervals. It may reach the upper limit value or the lower limit value of the sweep range during the first period, but it is preferable that the center frequency continues to increase or decrease in one first period. As described above, the center frequency sweep circuit 22 outputs the center frequency information capable of specifying the value of the center frequency of the light emitted by the light emitting element 10 to the center frequency determination circuit 20.

The sharing of functions between the center frequency determination circuit 20 and the center frequency sweep circuit 22 is optional. For example, the center frequency information determined by the center frequency determination circuit 20 includes the upper limit value and the lower limit value of the sweep range, and the center frequency sweep circuit 22 may control the set value of the drive circuit 38 with respect to the current circuit 39 according to the center frequency information. The center frequency determination circuit 20 or the center frequency sweep circuit 22 may determine the set value with respect to the current circuit 39 instead of the center frequency of light or the frequency range to be swept.

Further, the center frequency sweep circuit 22 sets the set value of the drive circuit 38 with respect to the current circuit 39 in the second period to a predetermined value that makes the bias current generated in the second period smaller than the bias current generated in the first period. In the present embodiment, the bias current generated in the second period is smaller than a threshold value of the bias current required to cause the light emitting element 10 to emit the light. That is, in the present embodiment, the light emitting element 10 does not emit the light in the second period. Further, when the center frequency continues to increase or decrease in one first period, a period obtained by combining the first period and the second period, and the first cycle may be synchronized with each other.

The second wave detection circuit 26 detects the peak of the intensity of the light transmitted through the atomic cell 12 by detecting the light intensity signal output by the current-voltage conversion circuit 16 using a second oscillation signal output by the second oscillator 32 in the first period, and outputs a second wave detection signal. The second oscillator 32 oscillates at a second frequency of, for example, substantially several hundred kHz to several MHz. The cycle of the second oscillation signal is synchronized with the first period, and for example, an integral multiple of the reciprocal of the second frequency may match the length of the first period. However, the integer is an integer of 1 or more. The oscillation frequency of the voltage controlled quartz crystal oscillator 28 is finely adjusted according to the voltage value of the second wave detection signal output by the second wave detection circuit 26. The voltage controlled quartz crystal oscillator 28 oscillates at, for example, substantially several MHz to several tens of MHz. Since the first frequency and the second frequency are different from each other, with respect to the light intensity signal based on the output of the photo detection element 14, the wave detection by the first wave detection circuit 18, and the wave detection by the second wave detection circuit 26 can be performed independently of each other.

In order to enable the wave detection by the second wave detection circuit 26, the modulation circuit 30 modulates an output signal of the voltage controlled quartz crystal oscillator 28 using the above-mentioned second oscillation signal that is supplied to the second wave detection circuit 26 as a modulated signal. The modulation circuit 30 can be realized by a frequency mixer (mixer), a frequency modulation (FM) circuit, an amplitude modulation (AM) circuit, or the like.

The first frequency conversion circuit 34 outputs the output signal of the modulation circuit 30 to the gain control circuit 36 by frequency-converting the output signal into a signal having a frequency of ½ of the frequency $\omega_{12}$ corresponding to an energy difference $\Delta E_{12}$ between the two ground levels of the alkali metal atom. The first frequency conversion circuit 34 can be realized by using, for example, a phase locked loop (PLL) circuit.

The gain control circuit 36 amplifies the output signal of the first frequency conversion circuit 34. The gain control circuit 36 can be realized by using, for example, an automatic gain control (AGC) circuit.

The drive circuit 38 includes the current circuit 39. The current circuit 39 generates a bias current having a voltage value in accordance with the set value from the center frequency sweep circuit 22. As described above, in the first period, the set value from the center frequency sweep circuit 22 changes at regular intervals so that the bias current also changes according to the change in the set value, as illustrated in FIG. 12.

The drive circuit 38 generates a drive current in which a current based on the output signal of the gain control circuit 36 is further superimposed on the bias current where a first modulated current is superimposed and outputs the drive current to the light emitting element 10. As illustrated in FIG. 12, the current based on the output signal of the gain control circuit 36 includes a high frequency current having a frequency of $\omega_{12}/2$ and a second modulated current based on the oscillation signal of the second oscillator 32. In the first period, as illustrated in FIG. 5, the center frequency changes according to the bias current, and the light emitting element 10 emits the light including a sideband having a frequency difference to the center frequency in accordance with the high frequency current.

In the atomic oscillator 100, in the first period, the two sidebands included in the light emitted by the light emitting element 10 are controlled to form a resonance light pair that causes the EIT phenomenon in the alkali metal atoms accommodated in the atomic cell 12 by a feedback loop that passes through the light emitting element 10, the atomic cell 12, the photo detection element 14, the current-voltage conversion circuit 16, the second wave detection circuit 26, the voltage controlled quartz crystal oscillator 28, the modulation circuit 30, the first frequency conversion circuit 34, the gain control circuit 36, and the drive circuit 38. Specifically, by the feedback loop, the feedback control is applied such that the frequency difference of the resonance light pair exactly matches the frequency $\omega_{12}$ corresponding to the energy difference $\Delta E_{12}$ between the two ground levels of the alkali metal atom.

As described above, by irradiating the atomic cell 12 with the light from the light emitting element 10 while changing the center frequency and increasing and decreasing the frequency of the sideband in the first period, the atomic oscillator 100 causes the EIT phenomenon in the plurality of alkali metal atoms accommodated in the atomic cell 12. Further, the atomic oscillator 100 reduces the intensity of the light incident on the atomic cell 12 in the second period as compared with the intensity of the light incident on the atomic cell 12 in the first period. Specifically, the atomic oscillator 100 stops the incident of the light on the atomic cell 12 by not causing the light emitting element 10 to emit the light in the second period. The atomic oscillator 100 generates the Ramsey resonance by repeating the first period and the second period and detects the peak of the Ramsey fringe appearing in the light intensity signal output by the current-voltage conversion circuit 16 by the second wave detection circuit 26. In the second period, it is preferable that no light is incident on the atomic cell 12, but a small amount of light may be incident as long as the intensity is reduced to the extent that the Ramsey resonance can be generated.

The principle of the wave detection by the second wave detection circuit 26 is the same as the principle of the wave detection by the first wave detection circuit 18 described above. That is when the frequency difference between the two sidebands included in the light emitted by the light emitting element 10, that is, the frequency difference between the resonance light pair is shifted to the higher side than $\omega_{12}$, a large number of frequency components of a second frequency $f_{s2}$ is contained in the light intensity signal output by the photo detection element 14, and the second wave detection circuit 26 outputs the second wave detection signal having the voltage value lower than the reference value. This second wave detection signal is input to the voltage controlled quartz crystal oscillator 28, and the second frequency $f_{s2}$ decreases. Further, when the frequency difference of the resonance light pair is shifted to the lower side than $\omega_{12}$, the second wave detection circuit 26 outputs the second wave detection signal having the voltage value higher than the reference value. This second wave detection signal is input to the voltage controlled quartz crystal oscillator 28, and the second frequency $f_{s2}$ increases. On the other hand, when the frequency difference of the resonance light pair matches with $\omega_{12}$, as illustrated in FIG. 12, a large amount of $2f_{s2}$ frequency components are contained in the light intensity signal that is output by the photo detection element 14, and the second wave detection circuit 26 outputs the second wave detection signal where the voltage value becomes the reference value. This second wave detection signal indicates that the peak of the intensity of the light transmitted through the atomic cell 12 is detected. This second wave detection signal is input to the voltage controlled quartz crystal oscillator 28, and the second frequency $f_{s2}$ is maintained. In this way, the feedback control is applied such that the frequency difference between the resonance light pair exactly matches $\omega_{12}$.

In this way, in the atomic oscillator 100, in the first period, by using the EIT phenomenon of the alkali metal atoms or the Ramsey resonance, the output signal of the first frequency conversion circuit 34 or the output signal of the voltage controlled quartz crystal oscillator 28 which are included in the feedback loop are stabilized at a constant frequency.

The second frequency conversion circuit 40 frequency-converts the output signal of the voltage controlled quartz crystal oscillator 28 to generate a clock signal having a desired frequency, for example, 10.00 MHz. This clock signal is output externally. The second frequency conversion circuit 40 can be realized by, for example, a direct digital synthesizer (DDS).

The second wave detection circuit 26 stores the voltage value of the second wave detection signal when the first period is ended, and in the next second period, the voltage controlled quartz crystal oscillator 28 oscillates at a constant frequency in accordance with the voltage value of the stored second wave detection signal. In this way, the second frequency conversion circuit 40 can generate the clock signal having a desired frequency even in the second period when the feedback control is not applied.

As described above, the shorter the first period, which is the width of one pulse of the light emitted by the light emitting element 10, the clearer the Ramsey fringe can be obtained, since the sweep velocity of the center frequency of the light emitted by the light emitting element 10 is determined by the length of the first period, it is necessary to increase the sweep velocity of the center frequency in order to obtain a clear Ramsey fringe. Therefore, the width of the sweep range of the center frequency is determined in consideration of the sweep velocity of the center frequency that can be realized in the light emitting element 10 and the Ramsey fringe to be obtained. The longer the second period, the thinner the Ramsey fringe, but since the peak of the Ramsey fringe is small, for example, the length of the second period is determined such that the frequency accuracy of the clock signal is the highest.

The light emitting element 10 corresponds to the light source 1 in FIG. 1. Further, the atomic cell 12 corresponds to the atomic cell 2 in FIG. 1. Further, the photo detection element 14 and the current-voltage conversion circuit 16 correspond to the photodetector 3 in FIG. 1. Further, a circuit, which is constituted by the current-voltage conversion circuit 16, the first wave detection circuit 18, the center frequency determination circuit 20, the center frequency sweep circuit 22, the first oscillator 24, the second wave detection circuit 26, the voltage controlled quartz crystal oscillator 28, the modulation circuit 30, the second oscillator 32, the first frequency conversion circuit 34, the gain control circuit 36, and the drive circuit 38, corresponds to the control circuit 4 in FIG. 1. Each circuit corresponding to the control circuit 4 is constituted by one or a plurality of circuit elements, and may include an integrated circuit (IC), a micro control unit (MCU), or the like.

Figure 15:
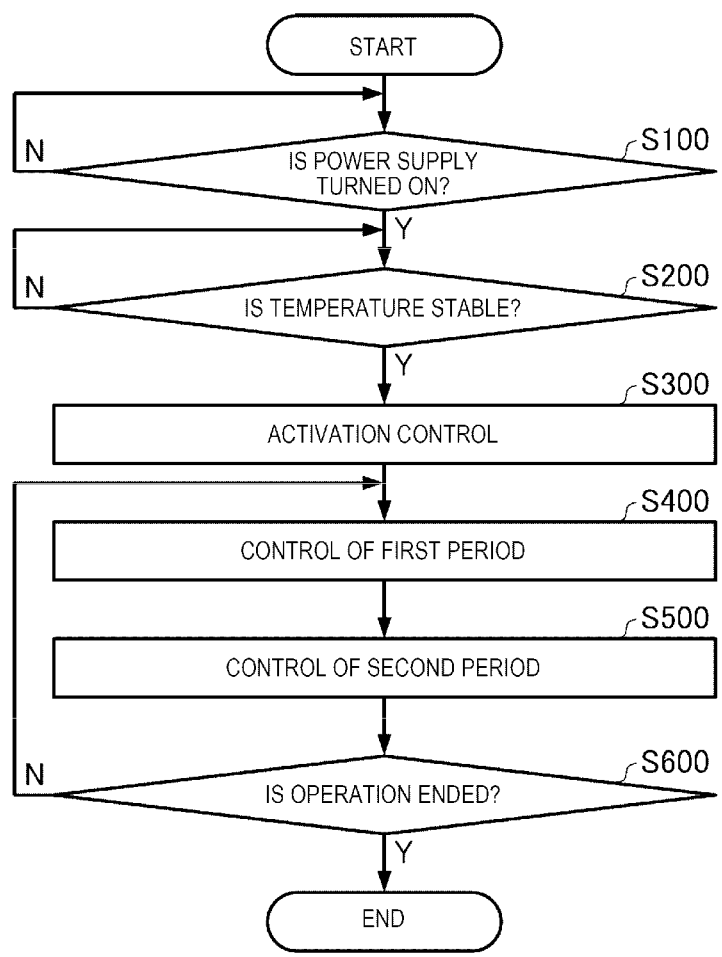
FIG. 15 is a flowchart illustrating an example of an operation procedure of the atomic oscillator.

FIG. 15 is a flowchart illustrating an example of an operation procedure of the atomic oscillator 100. As illustrated in FIG. 15, the atomic oscillator 100 waits until the power supply is turned on (N in step S100), and when the power supply is turned on (Y in step S100), the atomic oscillator 100 waits until the temperature of the atomic cell 12 stabilizes at the desired temperature (N in step S200). Thereafter, when the temperature of the atomic cell 12 stabilizes at the desired temperature (Y in step S200), the atomic oscillator 100 performs an activation control (step S300).

When the activation control is ended, the atomic oscillator 100 performs a control of the first period (step S400). When the control of the first period is ended, then the atomic oscillator 100 performs a control of the second period (step S500). When the operation is not ended (N in step S600), the atomic oscillator 100 performs a control of the next first period (step S400). After that, until the operation is ended by turning off the power supply (Y in step S600) or the like, the atomic oscillator 100 repeats the control of the first period (step S400) and the control of the second period (step S500), thereby the Ramsey resonance is generated.

Figure 16:
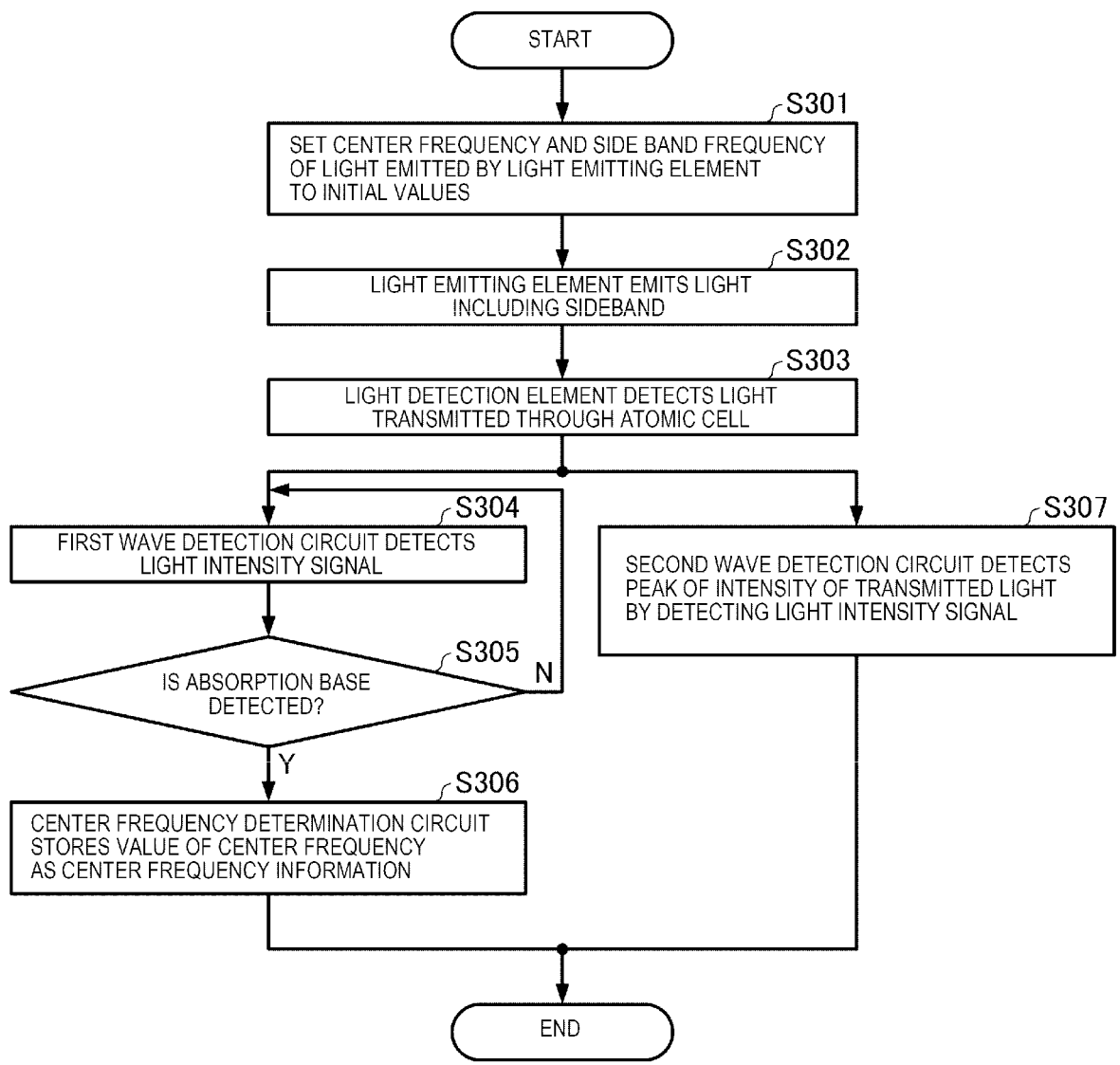
FIG. 16 is a flowchart illustrating an example of a procedure of an activation control.

FIG. 16 is a flowchart illustrating an example of an activation control procedure which is step S300 in FIG. 15. As illustrated in FIG. 16, in the activation control, the atomic oscillator 100 first sets the center frequency and the sideband frequency of the light emitted by the light emitting element 10 to the initial values (step S301). For example, these initial values are set to the value of the center frequency that is the absorption base or in the vicinity thereof of the light by a plurality of alkali metal atoms accommodated in the atomic cell 12 and the value of the sideband frequency at which the S/N ratio of the EIT signal is at the peak or in the vicinity thereof. For example, the optimum value of the center frequency and the sideband frequency design of the atomic oscillator 100, or the average value or the median value of the plurality of optimum center frequencies and sideband frequencies obtained by evaluating the plurality of atomic oscillators 100 may be used as the initial value. These initial values are stored in, for example, a non-volatile memory (not illustrated in FIG. 11). When the power supply of the atomic oscillator 100 is turned on, the initial value of the center frequency is transferred from the non-volatile memory to the center frequency determination circuit 20 and stored as the center frequency information, and the initial value of the sideband frequency is transferred from the non-volatile memory to the second wave detection circuit 26 and stored as the voltage value of the second wave detection signal.

Next, the light emitting element 10 emits the light including a sideband (step S302), and the photo detection element 14 detects the light transmitted through the atomic cell 12 (step S303).

Next, the first wave detection circuit 18 detects the light intensity signal obtained by converting the current that is output by the photo detection element 14 into a voltage by the current-voltage conversion circuit 16 (step S304). The first wave detection circuit 18 continues the wave detection until the absorption base is detected (N in step S305 and step S304). Further, when the first wave detection circuit 18 detects the absorption base (Y in step S305), the center frequency determination circuit 20 stores the value of the center frequency as the center frequency information (step S306).

Further, in parallel with steps S304 to S306, the second wave detection circuit 26 detects the peak of the intensity of the transmitted light by detecting the light intensity signal (step S307). Specifically, the second wave detection circuit 26 detects the peak of the EIT signal, and by the feedback loop mentioned above the two sidebands included in the light emitted by the light emitting element 10 are controlled to form the resonance light pair. The atomic oscillator 100 ends the activation control and transfers the process to the control of the first period.

Figure 17:
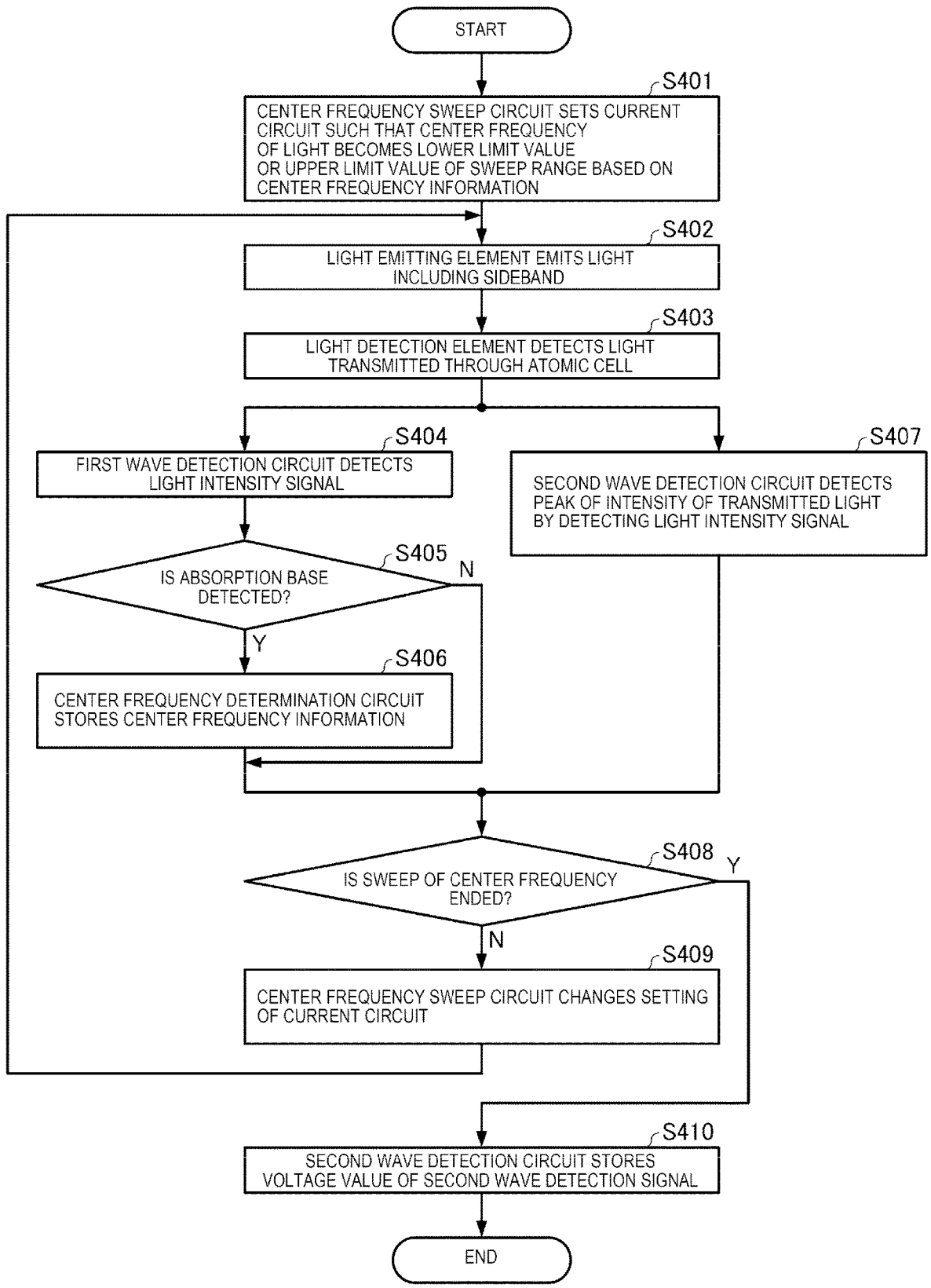
FIG. 17 is a flowchart illustrating an example of a procedure of a control for a first period.

FIG. 17 is a flowchart illustrating an example of the control procedure of the first period, which is step S400 of FIG. 15. As illustrated in FIG. 17, in the control of the first period, first, the center frequency sweep circuit 22 sets the current circuit 39 such that the center frequency of the light becomes the lower limit value or the upper limit value of the sweep range based on the center frequency information stored in the center frequency determination circuit 20 (step S401).

Next, the light emitting element 10 emits the light including the sideband (step S402), and the photo detection element 14 detects the light transmitted through the atomic cell 12 (step S403).

Next, the first wave detection circuit 18 detects the light intensity signal obtained by converting the current that is output by the photo detection element 14 into a voltage by the current-voltage conversion circuit 16 (step S404). When the first wave detection circuit 18 detects the absorption base (Y in step S405), the center frequency determination circuit 20 stores the value of the center frequency as the center frequency information (step S406). When the first wave detection circuit 18 does not detect the absorption base (N in step S405), step S406 is not performed.

Further, in parallel with steps S404 to S406, the second wave detection circuit 26 detects the peak of the intensity of the transmitted light by detecting the light intensity signal (step S407). Specifically, the second wave detection circuit 26 detects the peak of the EIT signal, and by the feedback loop mentioned above the two sidebands included in the light emitted by the light emitting element 10 are controlled to form the resonance light pair.

Next, when the sweep of the center frequency is not ended (N in step S408), the center frequency sweep circuit 22 changes the setting of the current circuit 39 (step S409), and the light emitting element 10 emits the light including the sideband (step S402). Thereby, the center frequency of the light emitted by the light emitting element 10 is changed. Further, the atomic oscillator 100 performs steps S403 to S407 again.

The atomic oscillator 100 performs steps S402 to S409 until the sweep of the center frequency is ended (N in step S408), and when the sweep of the center frequency is ended (Y in step S408), the second wave detection circuit 26 stores the voltage value of the second wave detection signal (step S410). The atomic oscillator 100 then ends the control of the first period and transfers the process to the control of the second period.

FIG. 18 is a flowchart illustrating an example of the control procedure of the second period, which is step S500 in FIG. 15. As illustrated in FIG. 18, in the control of the second period, the center frequency sweep circuit 22 sets the current circuit 39 such that the bias current becomes smaller than the threshold value (step S501).

Next, the light emitting element 10 stops emitting the light (step S502). Thereafter, until a predetermined time passes from the start of the control of the second period (N in step S503) when the light emitting element 10 stops emitting light (step S502) and the predetermined time has passed (Y in step S503), the atomic oscillator 100 ends the control in the second period.

According to the atomic oscillator 100 of the present embodiment described above, since the resonance generation method of the present embodiment is used, as described above, the possibility that the peak frequency of the Ramsey fringe fluctuates can be reduced, and the Ramsey resonance can be stably generated.

Further, in the atomic oscillator 100 of the present embodiment, since the Ramsey resonance is generated by irradiating the atomic cell 12 with the light in the first period and stopping the irradiation of the atomic cell 12 with the light in the second period, the plurality of alkali metal atoms accommodated in the atomic cell 12 do not need to move in and out of the light irradiation range and may stay within the light irradiation range. Therefore, according to the atomic oscillator 100 of the present embodiment, the cross section of the atomic cell 12 can be made to have the same size as the light irradiation range so that the atomic cell 12 can be miniaturized.

Further, according to the atomic oscillator 100 of the present embodiment, it is possible to detect the peak frequency of the Ramsey fringe having a high Q value generated by the Ramsey resonance and realize the extremely high frequency accuracy.

3. Modification Example

The present disclosure is not limited to the present embodiment, various modifications can be made without departing from the scope of the disclosure.

In the above embodiment, the intensity of the light emitted by the light source 1 or the light emitting element 10 in the second period is reduced as compared with the first period so that the intensity of the light incident on the atomic cell 2 or the atomic cell 12 in the second period is reduced as compared with the first period. Instead of this, a shutter is provided on the output side of the light source 1 or the light emitting element 10, the shutter is opened so that the atomic cell 2 or the atomic cell 12 is irradiated with the light in the first period, the shutter is closed so that the atomic cell 2 or the atomic cell 12 is not irradiated with the light in the second period, thereby the intensity of the light incident on the atomic cell 2 or the atomic cell 12 in the second period may be reduced as compared with the first period.

Further, in the above embodiment, by changing the center frequency of the light emitted by the light source 1 or the light emitting element 10, the center frequency of the light incident on the atomic cell 2 or the atomic cell 12 may be changed. Instead of this, the center frequency of the light emitted by the light source 1 or the light emitting element 10 is fixed, the light is incident on a modulator such as an acousto-optic modulator (ACM), and the modulator is controlled, thereby the center frequency of the light incident on the atomic cell 2 or the atomic cell 12 may be changed.

Further, in the above embodiment, the light emitted by the light source 1 or the light emitting element includes two sidebands, and the two sidebands are controlled to form the resonance light pair. Alternatively, the center frequency of the light emitted by the light source 1 or the light emitting element 10 and one of the two sidebands may be controlled to form the resonance light pair. Alternatively, by using two light sources, at least one of a first light source and a second light source may be controlled such that the first light source emits one of the resonance light of the resonance light pair and the second light source emits the other resonance light of the resonance light pair.

Further, although the atomic oscillator 100 using the resonance generation method of the present embodiment is taken as an example, the resonance generation method of the present embodiment can be applied to various quantum interference devices that cause the EIT phenomenon in an atom by the resonance light pair. For example, since the oscillation frequency of the voltage controlled quartz crystal oscillator 28 changes according to the change in the magnetic field around the atomic cell 12 by the same configuration as the atomic oscillator 100, a magnetic sensor can be realized by disposing a magnetic measurement target object in the vicinity of the atomic cell 12. Further, for example, since extremely stable coherence can be generated in the alkali metal atom by the same configuration as that of the atomic oscillator 100, by extracting the resonance light pair incident on the atomic cell 12, it is possible to realize the light source used in the quantum information device such as a quantum computer, a quantum memory, or a quantum cryptosystem.

The above-described embodiments and modification examples are just examples, and the disclosure is not limited thereto. For example, each embodiment and the modification example may also be appropriately combined with each other.

The present disclosure includes substantially the same configurations, for example, configurations having the same functions, methods and results, or configurations having the same objects and effects, as the configurations described in the embodiments. In addition, the present disclosure includes a configuration obtained by replacing non-essential portions in the configurations described in the embodiments. Further, the present disclosure includes a configuration that exhibits the same operational effects as those of the configurations described in the embodiments or a configuration capable of achieving the same objects. The present disclosure includes a configuration obtained by adding the configurations described in the embodiments to known techniques.

The following contents are derived from the above-described embodiments and modification examples.

One aspect of a resonance generation method includes: in a first period, causing an electromagnetically induced transparency phenomenon in a plurality of alkali metal atoms by irradiating an atomic cell, in which the plurality of alkali metal atoms are accommodated and a hydrocarbon film is disposed on an inner wall, with light while changing a center frequency; in the first period, obtaining a light intensity signal by detecting light transmitted through the atomic cell; in the first period, detecting an absorption base of light by the plurality of alkali metal atoms by detecting the light intensity signal; in the first period, determining a center frequency of light with which the atomic cell is to be irradiated in a next first period based on a result of detection of the absorption base; in a second period, reducing an intensity of light incident on the atomic cell as compared with an intensity of light incident on the atomic cell in the first period; and generating a Ramsey resonance by repeating the first period and the second period.

According to the resonance generation method, by using the atomic cell in which the hydrocarbon film is disposed on the inner wall, it is not necessary to seal a buffer gas in the atomic cell so that buffer gas shift does not occur, and a risk of fluctuations in a peak frequency of a Ramsey fringe caused by the Ramsey resonance is reduced.

Further, in the resonance generation method, even when the center frequency determined in the first period is shifted due to some factor such as noise generated in the second period, by irradiating the atomic cell with the light while changing the center frequency in the next first period, it is possible to detect the absorption base of the light by the plurality of alkali metal atoms, thereby the Ramsey resonance can be generated stably.

In one aspect of the resonance generation method, in the second period, an incident of light on the atomic cell may be stopped.

According to the resonance generation method, since the number of alkali metal atoms contributing to the generation of Ramsey resonance increases, the Ramsey resonance can be generated more stably.

In one aspect of the resonance generation method, in the first period, the center frequency of the light with which the atomic cell is irradiated may be changed with a width in accordance with a Doppler width of an absorption band of the light by the plurality of alkali metal atoms.

According to the resonance generation method, the absorption base of the light can be detected more reliably by changing the center frequency with a desired width in accordance with the Doppler width of the absorption band of the light, thereby the Ramsey resonance can be generated more stably.

In one aspect of the resonance generation method, the width for changing the center frequency of the light may be equal to or more than the Doppler width and equal to or less than twice the Doppler width.

According to the resonance generation method, by changing the center frequency with the width equal to or more than the Doppler width of the absorption band of the light, the absorption base of the light can be detected more reliably, and by changing the center frequency with the width equal to or less than twice the Doppler width of the absorption band of the light, the center frequency can be changed at a feasible velocity.

In one aspect of the resonance generation method, the light with which the atomic cell is irradiated in the first period may include a sideband, and the method may further include: in the first period, irradiating the atomic cell with the light while increasing and decreasing a frequency of the sideband; and in the first period, detecting a peak of an intensity of the light transmitted through the atomic cell by detecting the light intensity signal.

According to this resonance generation method, it is possible to detect the peak frequency of the Ramsey fringe having a high Q value caused by the Ramsey resonance, thereby the atomic oscillator having extremely high frequency accuracy can be realized by applying this resonance generation method, for example.

One aspect of an atomic oscillator includes: a light source; an atomic cell in which a plurality of alkali metal atoms are accommodated and a hydrocarbon film is disposed on an inner wall; a photodetector; and a control circuit, in which the control circuit is configured to, in a first period, cause an electromagnetically induced transparency phenomenon in the plurality of alkali metal atoms by irradiating the atomic cell with light from the light source while changing a center frequency and increasing and decreasing a frequency of a sideband, and in a second period, reduce an intensity of light incident on the atomic cell as compared with an intensity of light incident on the atomic cell in the first period, the photodetector is configured to, in the first period, output a light intensity signal by detecting light transmitted through the atomic cell, and the control circuit is configured to, in the first period, detect an absorption base of light by the plurality of alkali metal atoms by detecting the light intensity signal, determine a center frequency of light with which the atomic cell is to be irradiated in a next first period based on a result of detection of the absorption base, in the first period, detect a peak of an intensity of the light transmitted through the atomic cell by detecting the light intensity signal, and generate a Ramsey resonance by repeating the first period and the second period.

According to the atomic oscillator, by using the atomic cell in which the hydrocarbon film is disposed on the inner wall, it is not necessary to seal a buffer gas in the atomic cell so that buffer gas shift does not occur, and a risk of fluctuations in a peak frequency of a Ramsey fringe caused by the Ramsey resonance is reduced.

Further, according to the atomic oscillator, even when the center frequency determined in the first period is shifted due to some factor such as noise generated in the second period, by irradiating the atomic cell with the light while changing the center frequency in the next first period, it is possible to detect the absorption base of the light by the plurality of alkali metal atoms, thereby the Ramsey resonance can be generated stably.

Further, according to the atomic oscillator, it is possible to detect the peak frequency of the Ramsey fringe having a high Q value caused by the Ramsey resonance so that extremely high frequency accuracy can be realized.

What is claimed is:

1. A resonance generation method comprising:
   in a first period, causing an electromagnetically induced transparency phenomenon in a plurality of alkali metal atoms by irradiating an atomic cell, in which the plurality of alkali metal atoms are accommodated and a hydrocarbon film is disposed on an inner wall, with light while changing a center frequency;
   in the first period, obtaining a light intensity signal by detecting light transmitted through the atomic cell;
   in the first period, detecting an absorption base of light by the plurality of alkali metal atoms by detecting the light intensity signal;
   in the first period, determining a center frequency of light with which the atomic cell is to be irradiated in a next first period based on a result of detection of the absorption base;
   in a second period, reducing an intensity of light incident on the atomic cell as compared with an intensity of light incident on the atomic cell in the first period; and
   generating a Ramsey resonance by repeating the first period and the second period,
   wherein the light with which the atomic cell is irradiated in the first period includes a sideband, and
   the method further comprises:
     in the first period, irradiating the atomic cell with the light while increasing and decreasing a frequency of the sideband; and
     in the first period, detecting a peak of an intensity of the light transmitted through the atomic cell by detecting the light intensity signal.

2. The resonance generation method according to claim 1, wherein
   in the second period, an incident of light on the atomic cell is stopped.

3. The resonance generation method according to claim 1, wherein in the first period, the center frequency of the light with which the atomic cell is irradiated is changed with a width in accordance with a Doppler width of an absorption band of the light by the plurality of alkali metal atoms.

4. The resonance generation method according to claim 3, wherein
the width for changing the center frequency of the light is equal to or more than the Doppler width and equal to or less than twice the Doppler width.

5. A resonance generation method comprising:
in a first period
irradiating an atomic cell, in which an alkali metal atom is accommodated and a hydrocarbon film is disposed on an inner wall, with light having a first intensity while sweeping a center frequency within a sweep range, and
determining a center frequency of light with which the atomic cell is to be irradiated in a next first period based on a light intensity signal obtained by detecting light transmitted through the atomic cell; and
in a second period
reducing an intensity of light incident on the atomic cell as compared with the first intensity, and
generating a Ramsey resonance by repeating the first period and the second period.

6. An atomic oscillator comprising:
a light source;
an atomic cell in which a plurality of alkali metal atoms are accommodated and a hydrocarbon film is disposed on an inner wall;
a photodetector; and
a control circuit, wherein
the control circuit is configured to,
in a first period, cause an electromagnetically induced transparency phenomenon in the plurality of alkali metal atoms by irradiating the atomic cell with light from the light source while changing a center frequency and increasing and decreasing a frequency of a sideband, and
in a second period, reduce an intensity of light incident on the atomic cell as compared with an intensity of light incident on the atomic cell in the first period,
the photodetector is configured to, in the first period, output a light intensity signal by detecting light transmitted through the atomic cell, and
the control circuit is configured to,
in the first period, detect an absorption base of light by the plurality of alkali metal atoms by detecting the light intensity signal,
determine a center frequency of light with which the atomic cell is to be irradiated in a next first period based on a result of detection of the absorption base,
in the first period, detect a peak of an intensity of the light transmitted through the atomic cell by detecting the light intensity signal, and
generate a Ramsey resonance by repeating the first period and the second period.

* * * * *